United States Patent
Bundy et al.

(10) Patent No.: US 7,039,545 B2
(45) Date of Patent: May 2, 2006

(54) APPARATUS, SYSTEM AND/OR METHOD FOR CONVERTING A SERIAL TEST TO A PARALLEL TEST

(75) Inventors: Laura Marie Bundy, Fort Collins, CO (US); Julia Ann Keahey, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 22 days.

(21) Appl. No.: 10/827,888

(22) Filed: Apr. 19, 2004

(65) Prior Publication Data

US 2005/0234674 A1    Oct. 20, 2005

(51) Int. Cl.
*G06F 19/00* (2006.01)

(52) U.S. Cl. ............ 702/119; 702/121; 702/122; 702/123

(58) Field of Classification Search ......... 702/108, 702/118, 119, 120, 121, 122, 123, 182, 183; 714/5, 7, 32, 38, 125, 127, 724; 716/4–6
See application file for complete search history.

(56) References Cited

U.S. PATENT DOCUMENTS

| | | | | |
|---|---|---|---|---|
| 6,205,407 | B1 * | 3/2001 | Testa et al. | 702/119 |
| 6,473,707 | B1 * | 10/2002 | Grey | 702/123 |
| 6,574,626 | B1 * | 6/2003 | Regelman et al. | 707/6 |
| 6,662,312 | B1 * | 12/2003 | Keller et al. | 714/38 |
| 2002/0162046 | A1 * | 10/2002 | Krech et al. | 714/5 |

OTHER PUBLICATIONS

Agilent Technologies, www.agilent.com/see/concurrentest, "Agilent Concurrent Test" Nov. 1, 2001, 2 pages.
Agilent Technologies, www.agilent.com/cgi-bin/bvpub/agilent/editorial, "Concurrest Test Backgrounder", Aug. 13, 2003, 3 pages.
go/semiconductor, "Concurrent Test allows parrallel testing of IPblocks within each device", Autumn 2001, pp. 16, 1 page.
Mark LaPedus, Silicon Strategies, www.siliconstrategies.com, "Agilent claims breakthrough in test reuse' for SoCs", May 30, 2003, 2 pages.
Jeff Chappell, Electronic News, www.reed-electronics.com, "Agilent Unveils Core Test Language Browser", May 30, 2003, 2 pages.

* cited by examiner

*Primary Examiner*—Bryan Bui

(57) ABSTRACT

Test development tools, systems and/or methods which include providing access to a pre-established serial test program having a series of test code portions; providing for evaluating the series of test code portions and determining whether any respective test code portions of the series of test code portions are independently operable thereby allowing for combination in a new test program, the evaluating and determining steps providing at least one output result thereof; and providing for defining a new test program including a new test code portion for at least partially concurrently testing first and second sub-parts of a device under test using the at least one output result of the evaluating and determining steps.

21 Claims, 12 Drawing Sheets

APPARATUS, SYSTEM AND/OR METHOD FOR CONVERTING A SERIAL TEST TO A PARALLEL TEST

BACKGROUND

An important aspect in many manufacturing processes is the testing of the resulting products. Testing is used to verify that the manufactured products function and operate properly and perform in accordance with the specifications set forth by the product design. There are often pluralities of tests which may be performed on the product or products at different points or stages in the manufacturing process. For example, after a particular sub-assembly of a product is manufactured, there may be tests performed to verify the specific functions of the sub-assembly prior to its incorporation into an overall final product. In addition to or oftentimes as a preferred alternative to separate testing of the sub-assemblies or sub-components, there may be tests performed on the final overall completed product including testing of the one or more sub-components thereof after the final step of the manufacturing/assembling process.

In order to meet an ever increasing demand of consumers for the latest high technology products, manufacturers are forced to constantly design and deliver these new products to the marketplace in an ever decreasing time span. Techniques that shorten the time needed to bring a product to market can provide a competitive advantage over competitors who do not have access to such techniques. Consequently, any such techniques or mechanisms to shorten the time-to-market are desirable and may be readily accepted by manufacturers. Shortening the total time required to adequately test the functionality of the manufactured products is one way to decrease the time required and can thus be one if not the most time critical element in bringing a new product to market. As such, the overall test time may typically be a function of one or more factors, e.g.: (1) the run time of the test, i.e., the time it takes to actually perform a particular test on the device, and (2) the test development or set-up time, i.e., the time it takes to configure, verify and set-up the test equipment to perform the test. Thus, in order to decrease the total test time, it is desirable to find ways to shorten either or both of the run time and/or the set-up times of the tests.

Heretofore, integrated circuit (IC) and/or system on a chip (SOC) and/or multi-chip module (MCM) devices have been tested and verified using a variety of test methods. In some examples, IC and/or SOC devices have been tested and verified to be defect free using functional test vectors, i.e., electrical stimuli, such as those applied to the IC and/or SOC by the use of automated test equipment (ATE), which stimulate and verify the IC/SOC device functionality at the pin-level of the device. A practical advantage to the utilization of such equipment, ATE, for testing ICs and/or. SOCs, is in some embodiments, the use of multiple independent ports of a single ATE which will allow independent control of those multiple independent ports for parallel or concurrent testing of discrete portions of the ICs or often more especially the SOCs or like devices. In such cases, discrete pins (or pads) are discretely assigned to particularly defined ports of the ATE. Then the ATE can perform discrete test patterns concurrently via the separate ports.

Among other advantages, concurrent testing of this sort has enabled parallel testing of multiple intellectual property (IP) blocks within each device. Likewise, such a test system allows for concurrent testing of any number of on-chip functions. For example, such a system can test multiple logic, embedded memory and/or analog or digital IP blocks in parallel rather than sequentially. The only fundamental requirement, addressed in the design and test set-up phases, is that the discrete IP blocks and/or other logic on the IC and/or SOC (system-on-a-chip) device be isolated as designed so they are independently accessible, observable, and controllable and may thus be assigned to separate, discrete ports during the test set-up phase. Testing of this sort of SOC is allowed by the per-port architecture of the ATE which supports independent testing of the assigned blocks including such independent test parameters as period, timing, levels, pattern and sequencing.

Note, SOCs and likewise MCMs may be considered special kinds of ICs wherein SOCs and MCMs are devices which may contain an assortment of one or more circuit features such as intellectual property (IP) blocks in SOCs and/or multiple chips in MCMs. These may then include, for example, logic cores, memories, embedded processors, and/ or a range of mixed-signal and RF cores to support voice, video, audio and/or data communications. Thus, SOCs and MCMs may represent a sort of IC integration, where standalone IC chipsets are merged into a few or even into a single SOC or MCM. To save on development costs, several SOC or MCM vendors today are creating converged ICs that include a wide range of computational, communication, and/or entertainment functionality. Such devices may require many or all of these capabilities because their jobs may include obtaining data and/or executable code from or through various communication methods and/or protocols, decoding that data and/or code and then displaying, distributing and/or storing that data and/or executing the code to operate in accordance therewith.

However, given that these converged SOCs and/or MCMs may be highly elastic in the capabilities they will provide, the exact test requirements for each SOC or MCM is a function of the IP blocks or individual pre-existing chips integrated therein. Also, these converged SOCs and MCMs will typically require a full gamut of testing capabilities; from RF and mixed signal to high-speed digital, memory, and scan test. To test the various IP blocks using traditional ATE equipment has often involved the use of sequential testing. Parallel or concurrent test strategies, on the other hand, were made available by the use of a plurality of otherwise separate ports or channels in the ATE. A port is a connection on or from the ATE to a collection of one or more pins in/on the IC/SOC. Independent tests may then be performed concurrently or in parallel using separate ports so long as the pins are properly and separately assigned to separate ports. For example, a certain first set of pins on an SOC may be dedicated to a particular IP core on the SOC, and a second set of pins may similarly be separately dedicated to a second particular IP core on the same SOC; then, each of these sets of pins may then be assigned to separate ports on the ATE, and thus provide for separate and parallel, i.e., non-sequential testing of those two IP cores. This can then reduce test time; e.g., the same number of tests can be run at a reduced time so long as some of the tests are run concurrently. Reduced test time assumes however, that the pins are properly assigned to the appropriate ATE ports during test set-up.

As utilized herein, the term device is intended hereafter to include and refer to a chip or an IC and/or an SOC and/or an MCM as well as to a core or an IP block or other circuit part which may be separately definable as such. And thus, these are also intended to be used interchangeably, with the exception of those specific references to the term SOC where it may be discretely distinct from any ordinary chip or IC. Moreover, the term device is also intended to refer to and encompass a multi-chip module (MCM) (also known as an MCU, or multi-chip unit) which is a device having two or more chips or ICs (or SOCS, or any combination thereof) disposed on a single or common substrate.

SUMMARY

Herein disclosed are test development tools, systems and/or methods which may include providing for accessing a pre-established serial test program having a series of test code portions; providing for evaluating the series of test code portions and determining whether any respective test code portions from said series of test code portions have independent sub-test code portions that are independently operable thereby allowing for combination in a new test program, said evaluating and determining steps providing at least one output result thereof; and providing for defining a new test program including defining a new test code portion for at least partially concurrently testing first and second sub-parts of a device under test using the at least one output result of the evaluating and determining steps, the new test code portion having at least two of the independently operable sub-test code portions defined therein to operate concurrently.

BRIEF DESCRIPTION OF THE SEVERAL VIEWS OF THE DRAWINGS

The present invention, as defined in the claims, can be better understood with reference to the following drawings. The drawings are not necessarily to scale, emphasis instead being placed on clearly illustrating the principles of the present invention.

DETAILED DESCRIPTION

Figure 1:
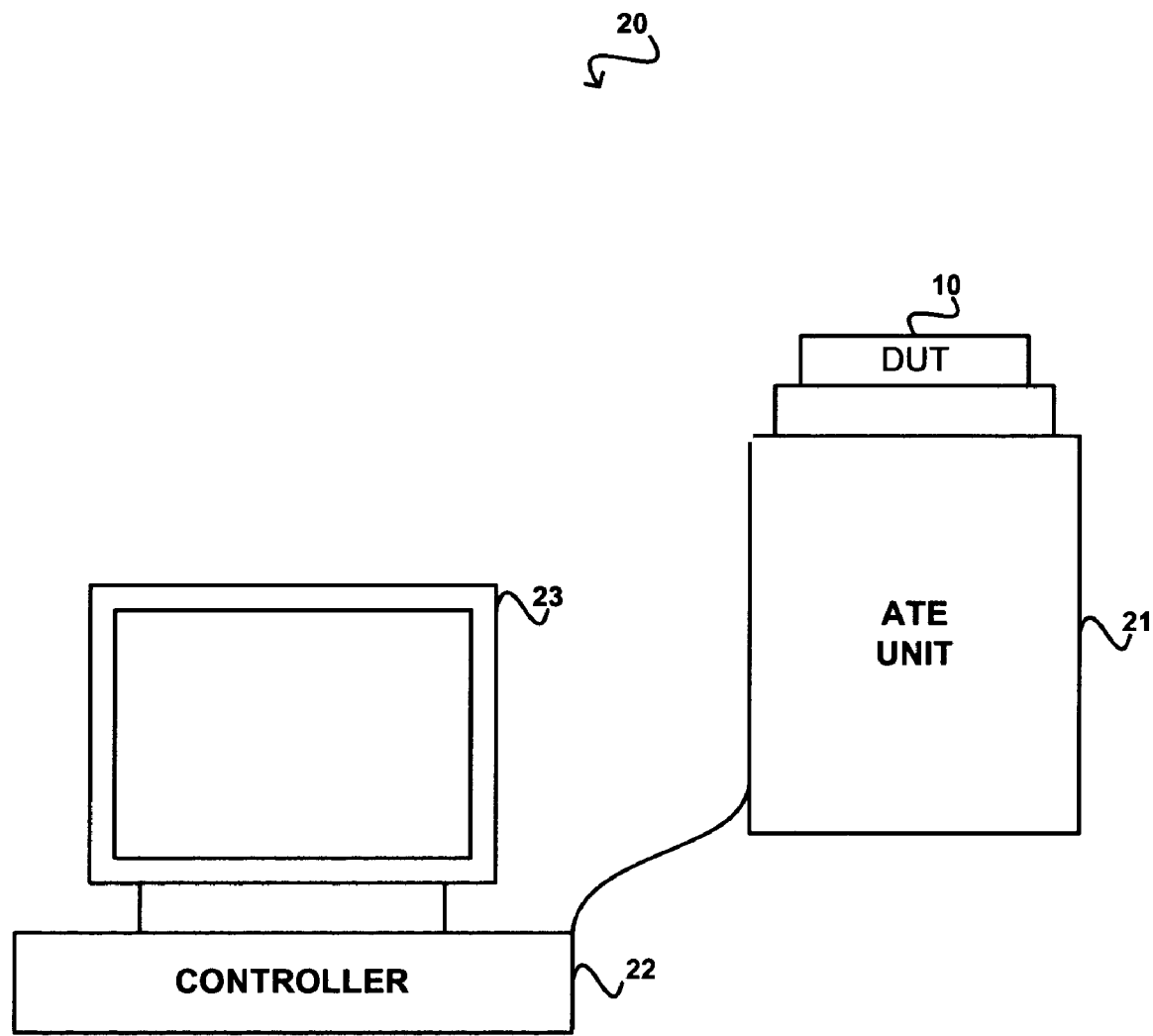
FIG. 1 is a schematic diagram depicting automated test equipment and a device to be tested therewith.

Reference will now be made in detail to the description of the invention as illustrated in the drawings with like numerals indicating like parts throughout the several views. The description to follow describes how the time element(s) associated with the running of a test may be shortened for a device under test by combining portions of an existing serial test within a new configuration of the pre-existing test for parallel execution. The testing of two sub-parts or elements in parallel may save in overall test execution time. In the pre-existing serial test, there is one, or there are many blocks of test portions, which include vectors, which are established to be applied to the device under test to exercise various sections of the device under test serially. The vectors in the test portions are evaluated to determine if the test activity on any groups of pins remain unchanged during certain blocks of test time, and if so, then corresponding sub-parts or sub-devices may be identified, which can then be set-up to be tested in parallel.

Exemplary embodiments of the present invention may be useful with various devices including integrated circuits, ICs, generally, or more particularly with systems-on-chips, SOCs and/or multi-chip modules, MCMs which have two or more independently testable parts disposed thereon or as parts thereof. A device 10 may represent either, as shown in FIG. 1, an integrated circuit, IC generally, or an SOC, or an MCM (and in some instances device 10 may represent a core 11, see description further below). Reference to any of these herein includes the others. Device 10 may also be referred to or known as a device under test, or DUT, or may be referred to using similar nomenclature. As further shown schematically in FIG. 1, DUT 10 will be connected in an overall test system 20 to automated test equipment 21. ATE 21 may have attached thereto or incorporated therein a test controller 22. Test controller 22 may further include input and/or output devices such as the display screen 23 shown and/or a keyboard, mouse, stylus, scanner, disk drive or other computer connection (a serial port, a local access network connection, cable, ethernet, WiFi, or the like) (none of which being shown separately).

Figure 2:
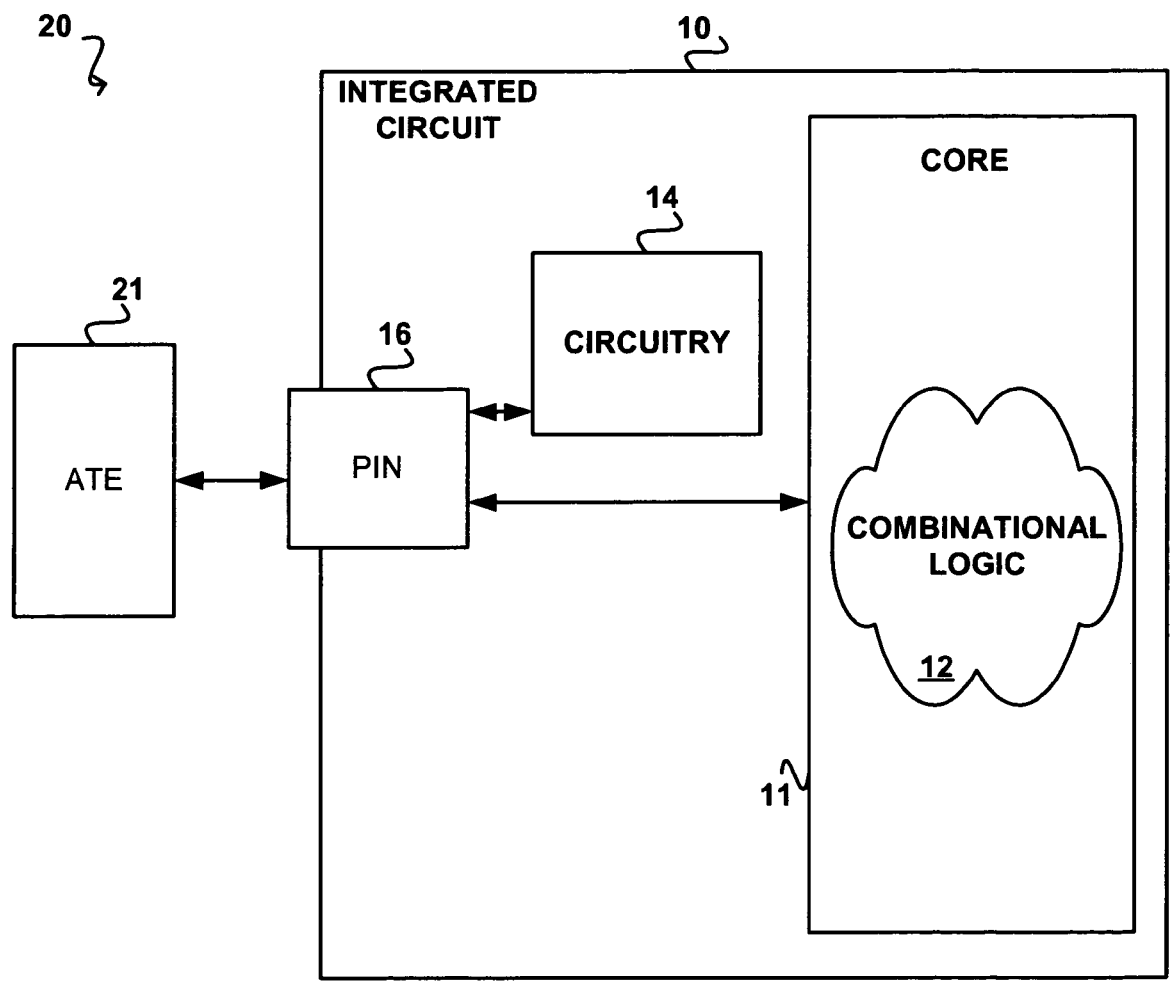
FIG. 2 is another schematic diagram depicting automated test equipment and a device to be tested therewith.

Referring now to FIG. 2, DUT 10 may then also include one or more sub-parts or elements such as the IP blocks or cores 11 (only one shown in FIG. 2), such as is the case with conventional SOCs. Such a DUT 10 and/or the sub-parts or core(s) 11 may also incorporate one or more sub-parts of combinational logic 12. DUT 10 and/or core(s) 11 may either or both also include other sub-parts such as integrated circuitry 14. A core 11, and/or logic 12 and/or circuitry 14 may electrically communicate with at least one pin or pad 16 of the DUT 10 which is configured to electrically communicate with devices external to the DUT 10, such as automated test equipment (ATE) 21, for example. So configured, an external device, e.g., ATE 21, may deliver signals to or receive response signals from the core 11, logic 12 and/or circuitry 14 via a transmission path which may include one or more pins or pads 16. When such communication is thus established, an overall test system 20 is created.

The ATE 21 may be configured to provide functional-based testing of circuitry contained on DUT 10 (e.g., circuitry 14), and/or more particularly, may provide testing for the combinational logic 12 within or outside the one or more cores 11. In order to accomplish such testing, the ATE 21 typically incorporates a stimulus generator and a response analyzer. More specifically, the stimulus generator in the ATE 21 may be configured to provide one or more test patterns for testing sub-parts such as the logic 12, circuitry 14 and/or of the core 11. The pattern or patterns provided to the logic circuitry may include digital data or signals, i.e., zeros and ones. In response to the various patterns, the logic circuitry under test then provides a response signal or signals to the response analyzer of the ATE 21 which is able to interpret the response and provide a test result signal which may otherwise be communicated or used by the ATE or the operator of the ATE in accepting or rejecting the device 10. Thus, the ATE provides for digital and/or analog, functional testing of one or more parameters of the core or other circuitry of the DUT 10 by applying digital test patterns to the logic circuitry of the core. Such automated testing has, heretofore, been substantially provided for by such external test equipment, i.e., ATE 21, by the generation and provision of digital patterns to the integrated circuit and/or SOC for facilitating testing of the logic circuitry thereof. An ATE test protocol often embodied in a test program which is adapted to provide the test signals and measure the responses corresponding to the at least one parameter of the device is also provided. More details of exemplary test protocols and/or programs including methods for device testing will be described herein below.

Figure 3:
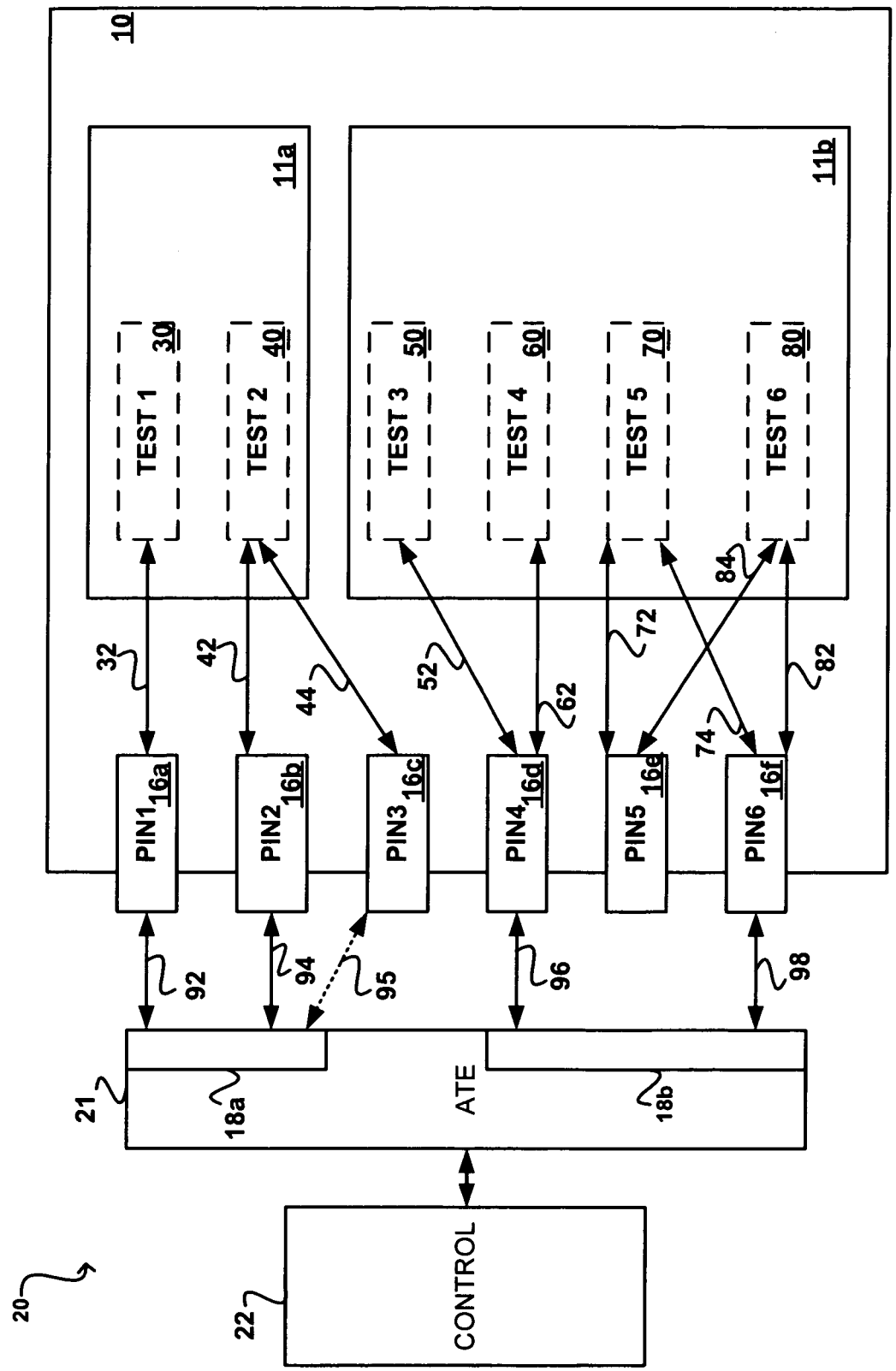
FIG. 3 is yet another schematic diagram depicting automated test equipment and a device to be tested therewith.
Figure 4:
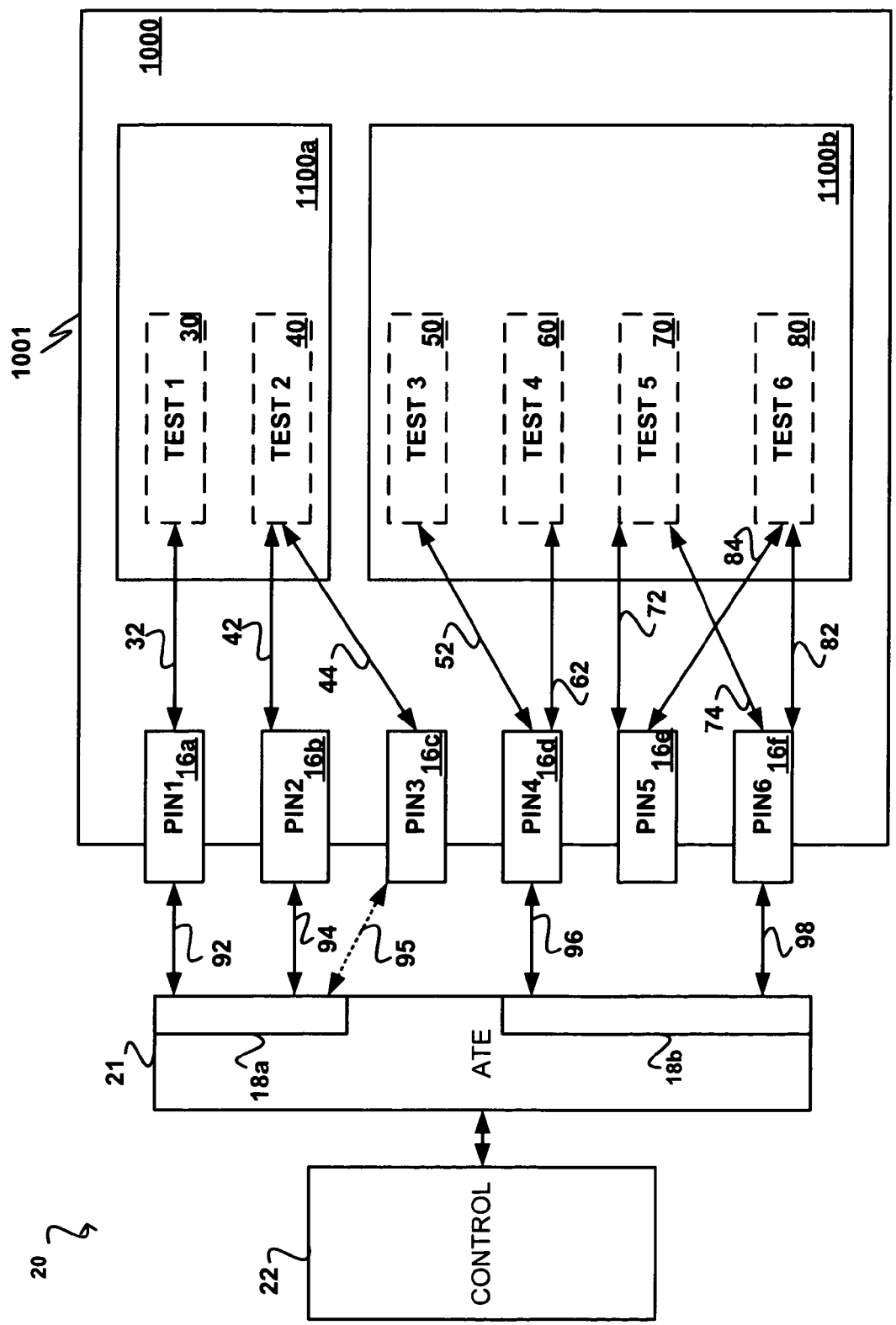
FIG. 4 is yet one further schematic diagram depicting automated test equipment and a device to be tested therewith.

First however, general characteristics of an exemplary embodiment of the analog and/or digital parameter test system 20 of the present invention will now be described in reference to the schematic representations in FIGS. 2, 3 and 4. As introduced above, system 20 incorporates an ATE 21 with a control 22 and a DUT 10 which may include one or more parts, logic, circuitry and/or cores 11. As shown in FIG. 3, a DUT 10 may include a plurality of sub-part cores 11 e.g., cores 11a and 11b. The core or cores 11 (and more particularly the combinational logics thereof) electrically communicate with one or more pins or pads 16, e.g., the six pins 16a–16f shown in FIG. 3, which pins are then configured to allow intercommunication of the combinational logic of the cores 11 with external devices, such as ATE 21, for example. Alternatively, the DUT 10 may, as shown and described herein, be an MCM/DUT 1000 as shown in FIG. 4 which is shown having a plurality of sub-part chips, here two chips 1100a and 1100b which may be commonly disposed on a substrate 1001. Chips 1100a and 1100b may be ICs or SOCs or otherwise. Here, the chips 1100a and 1100b may have and/or electrically communicate through and/or with one or more pins or pads 16, such as the exemplary six pins 16a–16f like those shown in FIG. 3, which pins are then configured to allow intercommunication of the sub-parts, e.g., the combinational logic of the cores 11 and/or chips 1100a and 1100b with external devices, such as ATE 21, e.g.

As described in detail hereinafter, ATE 21 may preferably be configured to provide selected/selectable ATE functionalities on one platform and, thereby, reduce the necessity for separate specialized automated test equipment for testing integrated circuits of various configurations. Such selectability of functionalities may, inter alia, be a result of the alternatively re-definable multi-port structure/system represented schematically by the ports 18, e.g., ports 18a and 18b in/on ATE 21 in FIGS. 3 and 4. Such ports 18a and/or 18b may be defined to be communicative with one or more pins 16 of DUT 10/1000. For example, port 18a is shown defined to communicate with pin 1 16a and pin 2 16b shown schematically via respective schematic communication lines 92 and 94. As described further below, pin 3 16c may or may not also be defined to be communicative with port 18a as shown by the dashed line 95. Similarly, port 18b may be defined to be communicative with pins 4 and 6 16d and 16f (and alternatively also pin 5 16e, though not shown) via respective schematic communication lines 96 and 98 (note, as understood, not all pins, e.g. pin 5 16e need be assigned to or otherwise communicate with a port or with the ATE). Defined this way, port 18a is defined to be communicative only with the pins of core 11a and not with any of the pins of core 11b while port 18b is conversely defined to communicate only with the pins of core 11b and not with any of core 11a. As will be described, this pin/port definition structure/method provides for the desirable parallel concurrent testing of the two cores 11a and 11b.

For example, as further shown in FIGS. 3 and 4, six exemplar tests are shown schematically (dashed lines) relative to cores 11a and 11b and/or chips 1100a and 1100b (note these tests are not generally intended to, though they could, represent structures, and are thus shown in dashed lines). These six tests are labeled as Test 1 30, Test 2 40, Test 3 50, Test 4 60, Test 5 70 and Test 6 80. The various tests may then involve electrical signals which are then electrically communicable/communicated to/from ATE 21 via respective pins 16 in a variety of path configurations. For instance, test 1 30 involves the communication of signals (to/from port 18a and ATE 21) through pin 16a via schematic transmission path 32 in/on DUT 10/1000; and test 2 40 involves the communication of signals in/on DUT 10/1000 via each of pins 16b and 16c utilizing schematic transmission paths 42 and 44 respectively. Similarly, test 3 50 and test 4 60 may each be represented by the electrically communicated signals passing to/from pin 16d via transmission paths 52 and 62 respectively; while test 5 70 communicates with pins 16e and 16f via transmission paths 72 and 74 respectively; and test 6 80 also involves electrical communications with pins 16e and 16f, albeit, via separate transmission paths 82 and 84 respectively. Thus, a DUT 10 and/or 1000 may incorporate various configurations of electrical signal intercommunications between the various pins and various cores, as well as various pin types and various test types.

Then as illustrative examples, and not for the purpose of limitation; it may be seen that a DUT 10 and/or 1000 (and/or the circuitry, and/or cores and/or chips thereof) may be tested by electrical signal communication with an ATE 21 via one pin (e.g., test1 30 via pin1 16a signals to and from the core 11a or chip 1100a) and/or via multiple pins (e.g., test2 40 utilizing multiple pins, e.g., pin2 16b and pin3 16c, whereby signals may be sent to and/or from core 11a (or chip 1100a) via one or the other or both; note, pin3 may or may not be connected to the ATE in this situation, depending upon the type of test test2 might be). Similarly, the various pins could be used in more than one test each (e.g., test3 50 and test4 60 both using the same pin4 16d and likewise, test5 70 and test6 80 both making use of pin5 16e and pin6 16f). Note, it is likely that if one or more pins are used for more than one test, then the tests may likely not be run concurrently, but rather separated in time, sequentially or otherwise as will be addressed in further detail below. Note also, though not shown, it is also possible that the pins could be used for more than one test and more than one core, but if so, then those tests would also likely have to be run at separate times, sequentially or otherwise, and thus, the cores with such overlapping pin definitions would likely have to be tested separately (at least for those tests), sequentially or otherwise.

Thus, the testing of devices such as ICs, SOCs and/or MCMs, i.e., DUTs 10/1000, may be implemented utilizing an otherwise conventional ATE 21, which may be enhanced by the inclusion of the present test set-up capability (e.g., software, program(s) and/or development tool(s)) in or in cooperation with the conventional ATE 21 which may provide for example, and not by means of limitation, one or more of the following test capabilities, including: the ability to measure time, voltage, current, resistance, capacitance, inductance, frequency and/or jitter, inter alia; the ability to measure, at specified times, voltage, current, resistance, capacitance, inductance, frequency and/or jitter, inter alia; the ability to provide data; the ability to drive data at specified times; the ability to receive data; the ability to receive data at specified times; the ability to provide reference voltage; the ability to sink or source current; the ability to provide high impedance; and the ability to calibrate in relation to ATE, among others.

As described further herein, parallel testing of multiple independent parts or sub-parts or devices installed on a single substrate, as the multiple sub-parts or cores 11, or logic 12 or circuitry 14 of a device 10, or the previously discretely extant chips 1100*a* and 1100*b* in an MCM 1000, for example, may result in a more efficient device test than simply running each test in one serial overall fashion. Parallel execution can result in faster execution time(s). Further time savings can be provided in the streamlining of the test development process as well as in the overall actual test time by the joining or combining in parallel of any pre-existing subtests or parts of subtests from a pre-existing serial device test or general portions of an otherwise non-pre-sectioned overall serial test for these independently testable sub-parts, i.e., logic 12, circuitry 14 or cores 11 or other devices (e.g., previously discretely extant chips 1100*a* and 1100*b* in an MCM 1000), into a single new parallel test, i.e., a test having elements which run in parallel. Hereafter follows a description of apparatus (e.g., tools), systems and/or methods for combining and/or converting two or more existing subtests or other general test portions from a pre-existing serial test into a new parallel test.

In exemplary embodiments, these types of combinations may take advantage of concurrent or parallel execution features, as for example where a working subtest or test portion can be integrated with one or more other working device subtests or test portions into a new combined subtest to work in parallel using multiple port features in an automated test environment (e.g., ATE 21). Such multiple port features provide parallel test features which allow for execution of different tests or test portions for different Intellectual Property (IP) cores (e.g., cores 11) or chips (e.g., chips 1100*a* and 1100*b*) or other device sub-parts with, in some if not most embodiments, independent timing. In the case of System-On-a-Chip (SOC) devices 10 and/or Multiple Chip Modules (MCMs) 1000 where multiple potentially independent sub-device parts (e.g., cores 11 or chips 1100*a* and 1100*b* or other separable parts of logic 12 or circuitry 14) have been combined on a single substrate (e.g., substrate 1001), there may have been created a single serial overall test which may include portions of such an overall serial test which represent tests/subtests or test portions for each such potentially independent sub-device or sub-part which can hereby be converted to run in a parallel fashion. Each sub-part (core or chip or logic or other circuitry) may then effectively become a new core (like cores 11, e.g., FIGS. 2 and 3) on the overall combination device 10 or 1000. Often such combination SOC or MCM devices or even mere IC devices are made up of devices/sub-devices/sub-parts (cores, chips, ICs, SOCs or mere circuit parts, logic or other circuitry) such that the overall combination devices may have otherwise been in production for some time previously, sometimes also wherein each such overall device may already have a corresponding working overall serial test already developed and used therefor. And, since comprehensive IC/SOC/MCM device tests can take months to develop, it should prove extremely beneficial to reuse each such previously-developed overall serial test, along with the potentially discretely testable sub-parts, i.e., cores/sub-devices/devices/chips. Note, hereafter, reference will be made to discretely testable sub-parts which phrase is intended to encompass circuit portions, cores, chips, ICs, SOCs, logic and/or other parts of circuitry, each of which also potentially having corresponding, perhaps separately identifiable test portions or subtests associated therewith within an overall pre-existing serial test, and each of which having been incorporated (and/or otherwise incorporable) onto a substrate with one or more other potentially discretely testable sub-parts to create an IC, SOC or MCM or like device which can have a parallel device test created in accordance herewith.

In a process for first identifying and if found, then taking two or more pre-existing test portions or subtests from a pre-existing single serial overall test, and then re-configuring them so that they may operate at least partially in parallel, there may be considered to be three general steps; namely, first, reviewing the pre-existent serial test to identify whether there may be any of a series of test portions (or subtest portions) within the overall pre-existing serial test by vector analysis and determining/deciding whether they may be independently operable and thus whether and how to organize a combination; then, second, actually combining the test or subtest portions, including combining the separate setups of vectors, timing and levels; and finally, if necessary, providing the test programs or testmethods to run the newly combined tests. An alternative embodiment summarization may include three primary considerations; namely, first, performing a vector analysis, second configuring the test portion setups into a single parallel setup, and third, configuring the multiple test portion execution sequences into a single parallel test execution or test flow to achieve a faster overall test time. Note, the test portions or subtests may be either previously not separately identified within the overall serial test, or may have been separately identified therein. Thus, any reference to first and/or second test portions includes either pre-defined separate test portions within the serial test as well as any previously not separately defined test or subtest portions within the serial test. An exemplary description of how a device may be defined and tested follows using particular terms which will be used throughout the rest of the process, apparatus and system descriptions following.

For example, the phrase device test will herein be intended to mean the software and firmware instructions required to control the electric or electronic stimulus or stimuli provided to and the analysis of the response(s) received, if any, from the device under test (DUT) 10/1000. Thus, a device test is the entire test protocol and/or program for a device whether the device is a pre-existent IC or SOC device 10 or an overall combination MCM device 1000 (a device 10 or 1000 or the like which is the resultant device of a combination of parts or sub-parts (circuits, logic, cores, or ICs or the like which are or may become independently identifiable). As described herein such overall devices having parts or sub-parts may be hereafter be referred to as overall devices or combination devices or complex devices, or the like). A device test may include one or more of a number of otherwise individual tests or portions of tests, hereafter referred to as subtests or test elements or test portions (in other art references such subtests or test elements may be referred to as "tests"; as for example when the otherwise separate voltage, current, resistance, capacitance, inductance, and/or frequency "tests," inter alia, may be delineated as separate elements in an overall test sequence and separately referred to as "tests" there; however, these same elements will be referred to here as subtests or test elements or test portions to avoid confusion with the overall device test which includes the entirety of any number of possible subtests or test portions desired for a particular device). As it may include many parts or elements (e.g., subtests or test portions), a device test may also be referred to as an overall device test herein. Note further herein a serial device test is a test for the overall device which exists prior to application of the tools, systems and/or methods hereof, and a parallel device test is an overall device test having at least two test portions adapted to run in parallel which may, for example, come into existence as a result of the application of the tools, systems and/or methods hereof. Generally also, the serial device test will have been previously created to test the entire pre-existing overall device, including any of the independently identifiable functions of and/or the sub-parts thereof. Then, the parallel device test can be formed from the taking of independently identifiable subtests or test portions from the serial test and joining them in ways allowing for parallel applications, resulting in faster test execution speeds/times.

Test vectors include the electrical, often digital signals or stimuli sent to the device under test (DUT) in pre-selected patterns, wave shapes, levels and/or periods/timing intended to elicit test response signals (or particular lacking(s) thereof) from the DUT. A device test and/or a subtest or other portion thereof may then include a number (at least one) of test vectors, including stimuli or inputs (at least one) and/or responses (zero or more) which can then be interpreted to determine the passage or failure of the test by the DUT. ATE 21 may be used to provide such vectors, which may include generating and sending the stimuli and/or receiving and/or analyzing the responses.

A test protocol may then be the compilation of steps necessary to accomplish the test, whether of the overall device test and/or the subtest(s). These steps may thus include the provision of test stimuli and/or receipt and/or analysis of test responses. A test protocol may, be for the overall device test or limited to any one or more subtests or test portions. A test sequence is the ordering of subtests or test elements or test portions in an overall device test. This might also be referred to as a test flow or execution or process or path or flowpath, particularly when viewed in a flow chart format. A test program is the software or firmware incarnation of the test protocol (or protocols) and/or test sequence making up the overall device test. Test code refers to the computer instructions in the test program and can be representative of the code for the entire test program or portions thereof. Thus, the term test code portion refers to one or more portions of the overall test code. Test code and/or a test code portion may include one or more test vectors. Test code and/or a test program may be embodied in a computer readable media as that term is described in further detail below. A test development tool may include the software, computer program, computer readable media, firmware and/or hardware which may be used to create and/or verify a device test and/or any test element thereof. Note also that the term development may be used with many of these other phrases to indicate the creation and/or verification of the new tests and/or subtests.

Figure 5:
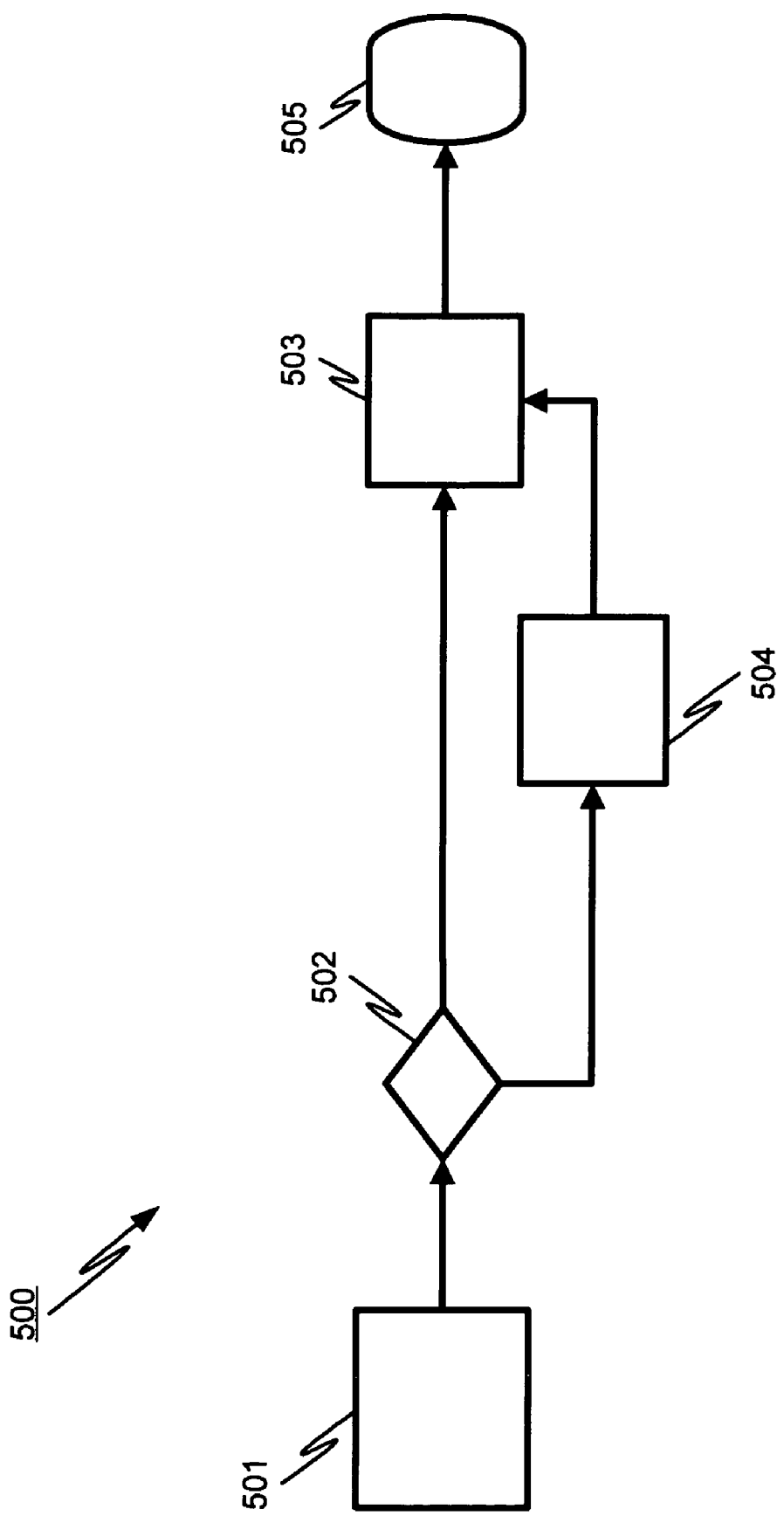
FIG. 5 is a flowchart depicting a testflow for testing a device using automated test equipment.

For further understanding of the conventions to be used herein, FIG. 5 presents a schematic view of a testflow 500 which is in the general form of a flow chart (though represented horizontally). As such, this flow 500 could represent an entire test flow with one or more subtests or other test portions, or only a partial flow. If it is an entire flow, it may thus also represent an entire overall device test, which consequently may also be identified by the reference numeral 500. In either case, a number of elements are included here, as for example, the boxes 501, 503 and 504; the decision diamond 502 and the curved shape 505 which is here intended to represent the end of the test flow (or at least this portion thereof when such a curved shape might indicate a jump to another test flow at a corresponding curved shape or other designation). Box 501 may represent merely a start for the flow, or it may also represent a subtest or other test portion, in which case it, like those subtest or test portion elements 503 and 504, would then include subtest protocol(s) which would in turn represent the steps of the electrical stimuli and responses or results and potentially also analysis thereof. In any event, the decision diamond 502 may represent a logic element such as an "if/then" or a "goto" control element or both, which may then direct execution flow from first block 501 either directly to subtest or test portion 503 or first to subtest or test portion 504.

Each of the individual test elements, portions or subtests (e.g., 503 and 504; and in some embodiments also 501) may then also have definitions thereof including not only the stimuli and results (digital inputs and responses which together are also known as vectors), but also timing and voltage level definitions which may be selected for the particular DUT. Analog testing may also be performed, in for example a mixed digital and analog test. If so, then the subtest or test portion will also want to have the analog setup and controls defined therein as well (usually, an analog test involves the use of digital signals and responses which are communicated to and from the DUT as such even though they represent and/or actually test analog portions of the DUT). Thus, analog execution and results definitions may then also be defined in each such subtest or test portion which incorporates an analog test portion. Note, an overall pre-existing test as used herein, may not be pre-sectioned or pre-segmented into previously-identified subtest elements such as elements 503 and 504, e.g. Rather, the tool, system and/or method hereof may create such subdivisions as an early step as described in further detail below.

Further, each device test whether for the combination device 10 or 1000 or for each sub-device 10 or 11 (or 1100a or 1100b) or sub-device part such as logic 12 or circuitry 14 which is a component of the combination device 10 or 1000 as existent in the previously existent overall multiple device/ multiple core combination device, may have an existing working device subtest or test portion description defined within the corresponding pre-existing overall serial test. To combine serialized parts from a previously existing combined component device serial test into parallelized parts in a single overall parallel device test, the respective setups and definitions of the respective otherwise separately serially testable sub-parts (e.g., devices 10 or 11 or 1100a, 1100b or parts 12 or 14) will be combined into a new overall parallel device test, in many embodiments retaining the same or partially the same structure. Each individual part, i.e., each core or device or logic or circuit part may have a working definition made up of various elements such as the inherent pin definitions and resource assignment(s), as well as the voltage levels and timing details and hence also the digital signals or vectors for normal operation and/or testing of the sub-device or part. Moreover, if the sub-device or part has any analog parts or analog functionality(ies), then the sub-device or sub-part may also have some analog definitions such as what may be the analog instrumentation, how to interconnect the sub-device or sub-part for analog access (electrical communication) and/or how to communicate and/ or display analog results. These previously existing sub-part definitions may now be joined together in single sets of test definitions, keeping the sub-parts independent by using port definitions.

An existing, overall, serial full pin device may thus contain independently testable elements, parts or cores. For simplicity in description, these may thus be referred to as sub-parts hereafter. The overall device may not truly be a multiple core device, but may simply have different pins which provide access to various digital functions, these various digital functions perhaps being independently testable. The apparatuses, systems and/or methods described here thus seek to identify these individual components and/or functions, to separate them into two or more independently accessible parts of the overall device. A primary mechanism to do this is a vector analysis which evaluates the activity of the vector(s), i.e., the stimuli and responses in the original overall serial test. Each potentially separately testable, potentially independently definable sub-device or other sub-part of an overall combination device (e.g., devices 10 or as incorporated cores or devices 11a, 11b or 1100a, 1100b or even logic 12 or circuitry 14) may already have been, but most likely will not have been, and now may become defined as and/or assigned each to its own independent port 18, so the separately identifiable subtests or test portions of the previously serial overall test can be run in parallel with other previously separate subtests or test portions from the same previously serial overall test. Each of the potentially separately identifiable subtests or test portions may previously have been associated with one or the other of the separately testable incorporated cores or other sub-parts (e.g., cores or devices 11a, 11b or 1100a, 1100b or logics 12 or circuits 14). Such a port assignment allows for dissimilar timing for the electronic test stimuli, e.g. vector periods, independent vector sequences, and ultimately parallel execution.

Overall combination devices having two or more independent cores or other separately identifiable sub-parts, also have numbers of pins that often together provide access to a single sub-device entity or sub-part of the overall device (e.g. cores or devices 11a, 11b or 1100a, 1100b or logics 12 or circuits 14). In some cases, common pins such as clocks may apply to two or more cores or sub-device entities or sub-parts. The first step for conversion of such an overall serial device test, to a parallelly-executed test is to identify the independent groupings of pins for port definitions. This is based on a vector analysis, i.e., an evaluation of the stimulus/response sequence of the overall, initially pre-existing serial test. Ultimately, these identified groupings of pins will be used, as described further below, in defining a different port for each independently accessible core or like separable, chip, logic or other circuitry, either of which hereafter referred to as a sub-part. Any keep-alive clocks may be defined into separate ports. Any common pins may be defined into separate ports to preserve the independence of the main ports of the cores. The cores are defined as common, such as the clocks and pins used for both new portions, or independent.

However, how to assign the pins and ports, and/or any sub-devices or sub-parts as may be identifiable as such via the pin assignments, will generally be first dependent upon analysis of the pre-existing serial device test to determine appropriate parallel test opportunities. Opportunities may include, for example, eliminating long periods of no activity on separately identifiable groups of pins. The device tests (overall device test and subtest portions) herein may generally be defined by a combination of test flow, and in some cases, individual subtest setups and results analysis. To merge in parallel two different pre-existing subtest portions from a serial test, decisions should be made on how best to combine the various test activities. This may involve a combination of user input, and automatic analysis. An automated test development tool (which may be a part of a more comprehensive test development tool) may be used to show and/or analyze the vector considerations of each subtest portion. The user may then be involved to ensure the behaviors of all parts of the device under test, as for example, of any sub-devices or sub-parts (i.e., the sub-devices of any of the overall combined IC, SOC or MCM-type devices) are appropriately considered and the desired test strategy would then be met.

In many cases within the pre-existing serial test, the user may keep some, or a substantial number of the individual subtests or test portions as is within the serial flow, and in such a case, the two (or more) previously extant test portions can simply be left as they exist in the pre-existing serial test, with a first sub-part of the overall device being fully tested according to the first subtest flow, followed by an execution of the test flow for the second sub-part. However, an often desirable option for organizing the combination device test is creating parallel execution of two or more relatively independently operating subtests or test portions by defining these subtests or test portions to operate concurrently on two or more ports. Creation of parallel or concurrent subtest executions would in many cases, provide a parallel device test which would be more efficient time-wise, and thus more desirable in many instances. Methods, systems and/or apparatuses to achieve such parallel tests of such multiple separately identifiable sub-parts combined into an overall device will now be described in more detail.

In particular, the vector analysis involves first, evaluation of the vectors (i.e., stimuli and response patterns) for identification of active and inactive pins (this may typically include identification of large periods of time (vectors*period—not timing) where nothing changes on the vectors of certain pin sets and no responses are measured on the same pins) that can be defined into ports. Then, these identified groups of pins are split into, or defined into ports. And, a timing comparison can be performed to determine preferred parallel test situations. Then the vector sequences are recreated and executed in parallel. This allows large quantities of basically unused vectors to be removed. If no pins with no activity are found for long vector counts, then the device would generally not be suitable for splitting to parallel operation. Likewise, if some control pins prove to be mutually exclusive in the active segments, the parallel operation is not possible. So the process would end if either of these latter situations occurs.

A more specific description of an embodiment of the vector analysis will now be set forth. Evaluation of the existing digital vectors for combining portions thereof into port-based vectors may often be the first step in a process and/or as taken by a tool or system hereof. Vectors are the digital values to be applied to individual pins in the hardware sequencer. The original vectors or a set of vectors may be defined by/with vector labels. These vector labels may be called out, i.e., defined directly in the subtests, or test portions, or they may be combined in what may be called a "burst" of several vector labels. A burst may be a communication of one or more vectors, e.g., one or more vector sets or labels communicated to a single port at a time, or often, a communication of a combination of vector sets to a plurality of ports at the same time or at relative times. Thus, in the creation of the new parallel overall device test, the vector sequences defined within the new subtests may be called out in a multiple port burst. When converting to ports, each of the individual vector sequences from the previously separate sub-part subtests, and/or other sub-part test portions, will be given the appropriate port identifier so that it will continue to communicate to/with the appropriate separate sub-part. See for example, subtest1 801 and subtest2 802 of FIG. 8 wherein respective vector sets, i.e., collections of binary data in particular grouped patterns are shown as initially collected in whole groups, and then also, as identified to be broken into newly labeled sub-part forms for corresponding ports A, B and C and a clock port. In this way, the original independent vector sequences or sets may be redefined merely by port definition/assignment, and otherwise remain substantially unchanged. The originally defined wave tables may then be used, see group 803 for port B, groups 804a and 804b which together define the group 804 for port C and group 805 for port A, and groups 806a and 806b defining the clock port 806, having been transposed to the new numbers. Then, all of the original vector sequences 803–806 may be available in the new port version of the combined subtest 810. Original vector labels from the two subtests will be combined when the vectors are combined. Wave table definitions will not need to be redefined, just given all ports in their designation.

Figure 8:
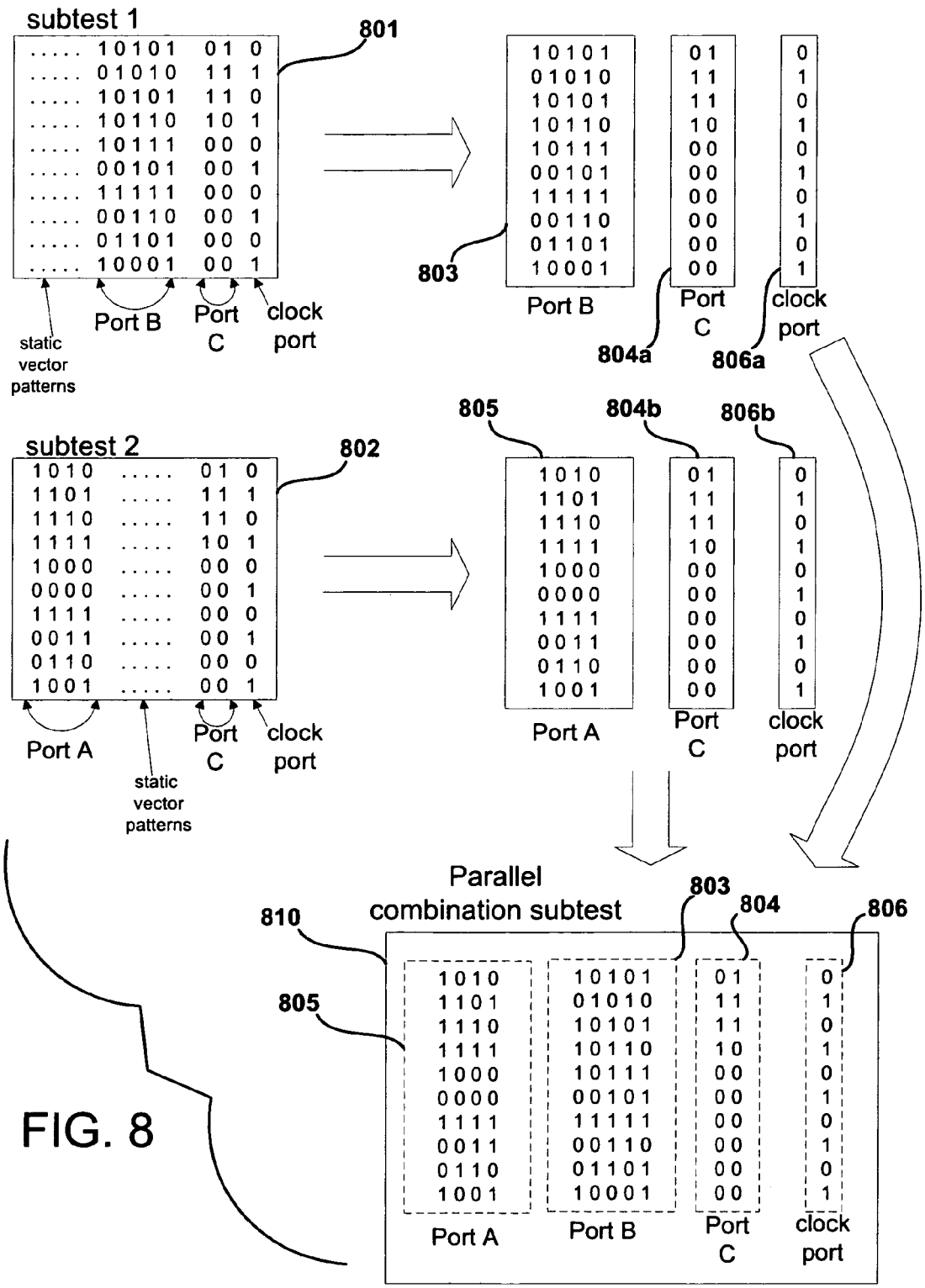
FIG. 8 is a relational diagram depicting a conversion of two subtests to one combination subtest.
Figure 9:
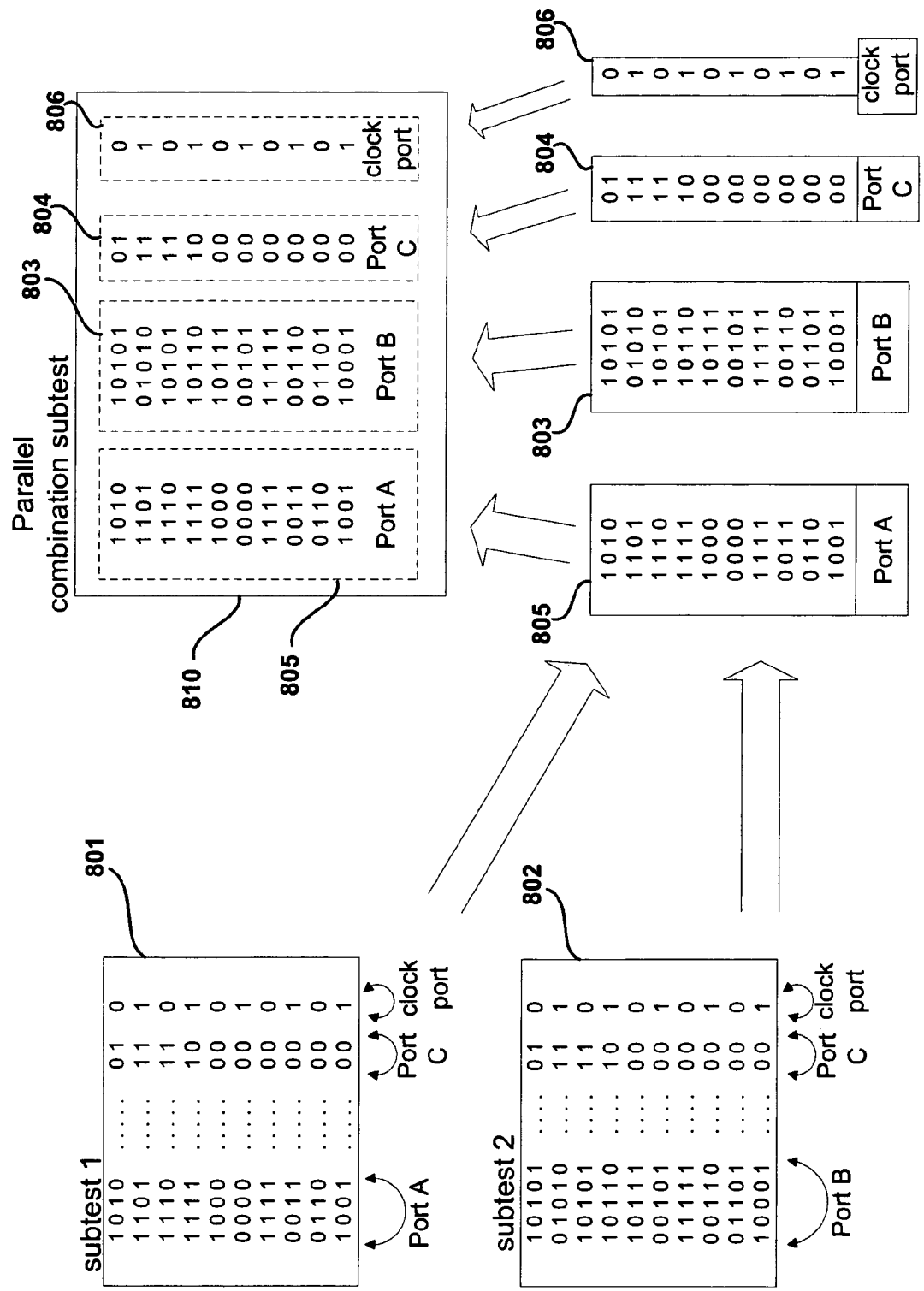
FIG. 9 is an alternative relational diagram depicting a conversion of two subtests to one combination subtest.
Figure 10A:
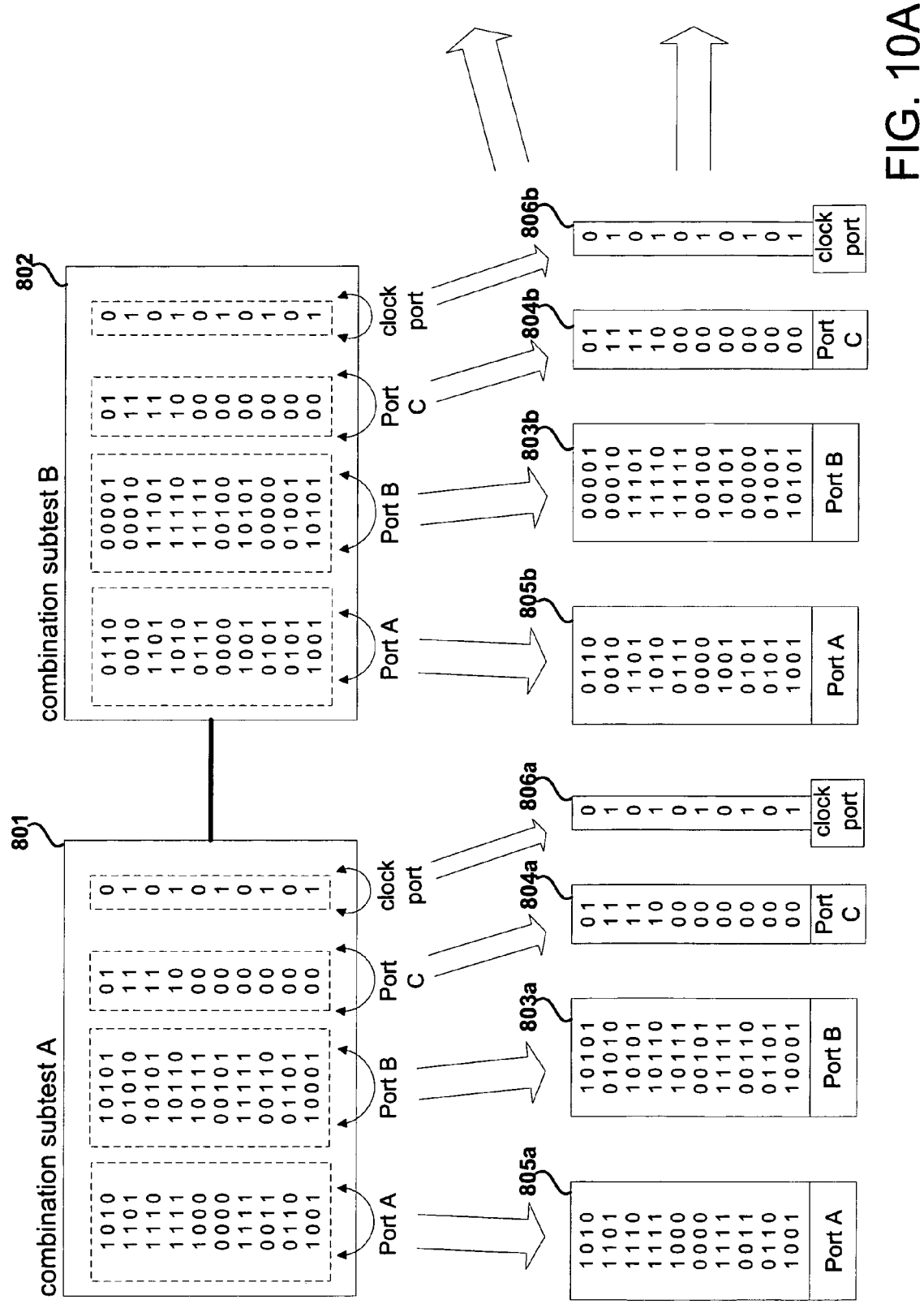
FIG. 10 is yet another alternative relational diagram depicting a conversion of two subtests to one combination subtest.
Figure 10B:
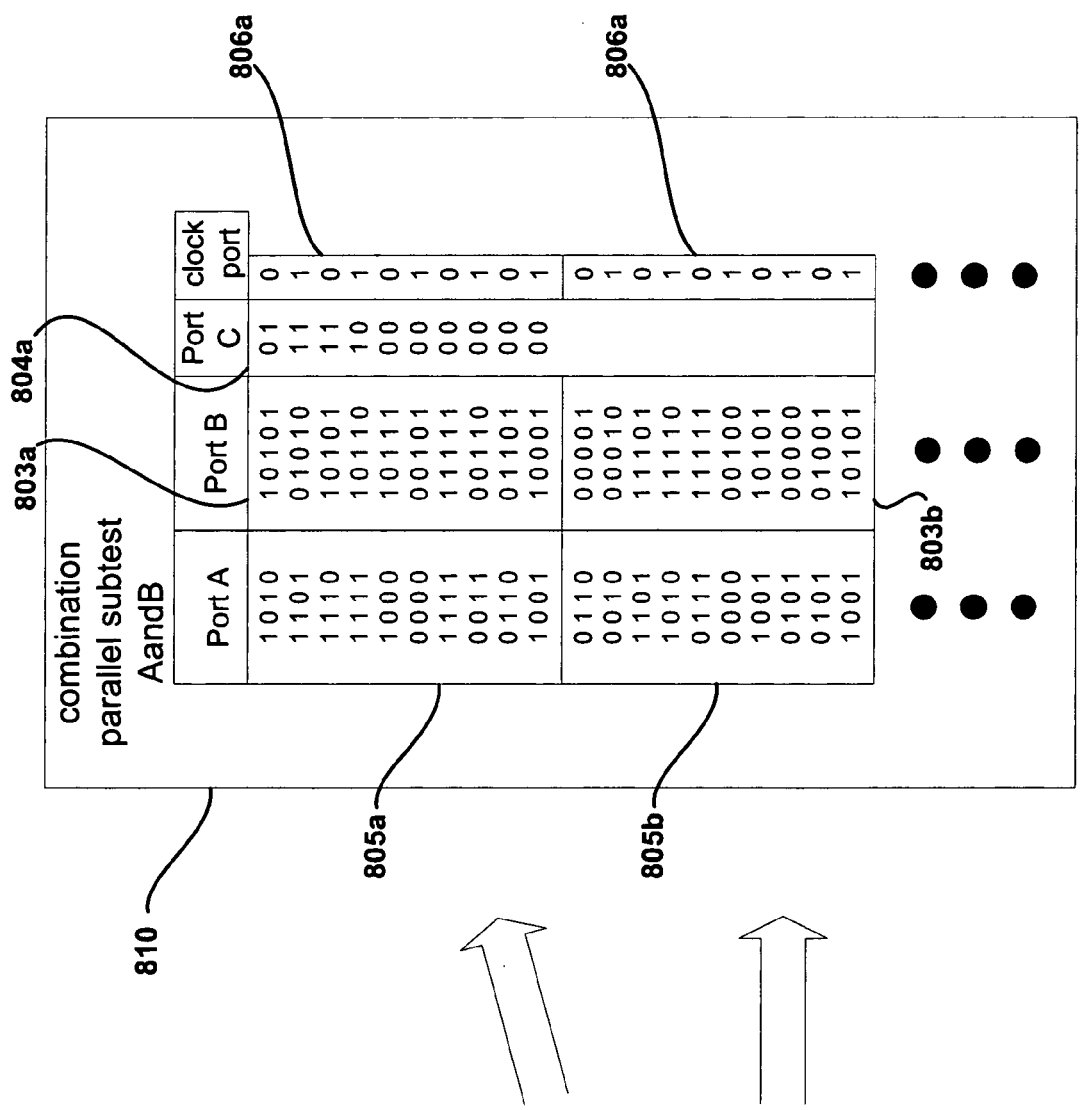

See also FIG. 9 wherein a similar breaking of the vector sets of two subtests 801 and 802 (similar, though not identical to those in FIG. 8) into port identified vector parts 803, 805, 804 and 806 which are then wholly moved into the parallel combination subtest 810. Note, the duplicate port C and clock port parts are not shown in FIG. 9, such step being incorporated into the intermediate step of FIG. 9, although the end process resulting in a similar final parallel combined subtest 810 as in FIG. 8. Moreover, see also FIG. 10 (comprised of sub-part FIGS. 10A and 10B) wherein a further similar breaking of vector parts from two pre-existing subtests 801 and 802, see FIG. 10A, is shown wherein each of the subtests 801 and 802 had vector portions 803a and b, 804a and b, 805a and b, and 806a and b for each of the end identified ports A and B, and C and clock, such that all of the vector portions may then be combined as shown in the resultant parallel subtest 810 of FIG. 10B. As noted above, these vector patterns or portions may be parts of test code, as in computer code, definable by a test pattern generator, and executable and/or readable by the test equipment.

In FIG. 8, now described in more detail, the respectively identified vectors or pin sequences from two previously separate subtests, subtest1 801 and subtest2 802 may first be separately defined to discrete ports, ports A, B, C and a clock port, being separated into corresponding groups 803–806 for ultimate assimilation in a new combined subtest 810. Note, static vector patterns in each of the prior existing subtests may be included or ignored in the creation of the final combined subtest 810 as they will be replaced with active patterns from another subtest. As introduced above, vectors from two previously separate subtests, subtest1 801 and subtest2 802 are shown as separate single serial test vector sequences. Then, these are reviewed to define portions of the vector sequences, based on columns (each column corresponding to the stimuli presented to a corresponding pin), to ports, e.g., ports A, B, C and a clock port. This takes the form of separating the columns into corresponding groups 803–806 for ultimate assimilation in a new combined subtest 810. Note, static vector patterns, i.e., where the pins show the " . . . ", means that there is no activity on those pins at that time in each of the prior existing subtests, and thus these may be included or simply ignored in the creation of the final combined subtest 810. On the other hand, the zeros and ones (0 or 1, or e.g., high and low states, H and L, or drive and receive, etc.) reflect digital active states or data values, each column reflecting a serial application of states for a particular pin of the device under test. Thus, in FIG. 8, a first group of pins has a static vector pattern ( . . . ), and a wide number of other pins have active binary (0 and 1) digital patterns. As the static pin patterns do not change/toggle state, these are ignored in the first conversion step, where the other patterns are identified in groups which can then be assigned port names (e.g., ports B, C and clock; see the separated groups 803, 804a and 806a for the first subtest 801).

This identification and separation into groups may preferably involve some analysis for logical ordering, such as, determining from review of the pattern(s), or other given information, how best to organize the groups. In a first example, it may be determined from review of the patterns (or other given information) that a certain column of states on one or more pins toggles back and forth (by following the column top to bottom), in a substantially symmetric pattern (e.g. 0 1 0 1 0 1, etc.), and this may thus represent a clock function (working with appropriate independent port patterns for parallel execution to properly stimulate the device to enter the appropriate mode on the independent ports), which may then indicate isolation and/or separation and assignment into a clock port/group 806a as taken from, e.g. subtest1 801 (and see clock port 806b from subtest2 802). Another grouping concept may include finding a pattern or patterns which repeat on the same pins in more than one subtest, here e.g., both subtest1 801 and subtest2 802, where it can be seen that a two pin group (two columns) in each of these subtests is the same, i.e., pins have same valid states at the same time, and may thus be collectively separated and identified and/or assigned as a common group or port, port C 804 (see initial separations 804a and 804b from the original subtests 1 and 2, and, then, the final collection 804 in the final combination subtest 810). The other, remaining groupings of patterns may then be identified and/or assigned in their separate groups/ports, see e.g., portB 803 for original subtest1 801 and portA 805 from original subtest2 802. Note, it may be that port identifications pre-existed in each of the pre-existent subtests and either accepted or rejected in favor of new definitions; however, this may not be common, nor is it necessary as this process may be performed as described here. Then, ultimately, these vector patterns as defined to ports, may then be collected into an array within a final combination subtest 810, where it can be seen that the four ports from the original subtests, combining the clock 806a and 806b and common ports 804a and 804b into corresponding single ports 806 and 804, and ignoring the static vector patterns, may now be made to run substantially simultaneously in parallel, or concurrently and thus provide for faster overall completion of the subtest(s), i.e., shorter test time(s). This final collection definition in a combination subtest 810 may also include what is known as creating a multiple port vector label.

In general, each subtest will have a vector sequence. In some more specific situations, the sequence of a particular subtest will entirely apply to a particular sub-part of the overall device, such that that subtest also applies to all the pins on/associated with that sub-part. The first step is to separate the full pin sequence into the user defined ports. The port sequences may be split out into sequences for each individual core/sub-part. At this point, the period of all vectors may be maintained to the period of the original subtest. Each label defined in a subtest may now have a single vector sequence associated with it. The names will be the original label name plus the new port name. Depending on the tester (i.e., ATE), the label will point to a single label, or a collection of labels for the single test, the structure will match the original. Now where there was a single collection of vectors for all pins, there are now two or more for each port. The label or collection of labels used in each subtest, may then be evaluated for activity then execution time to determine if and when the cores can be exercised in parallel. Only the independent port vector labels will be evaluated. To determine if the cores are truly independent for each subtest, the tool will look for complete vector sequences that do not have any pin behavior changes. Effectively, if only a single vector is executed repeatedly during the sequence, this core can be assumed to be inactive during this subtest. These vector labels are defined as 'inactive'. The vector label of the other core should have vector variation, indicating that this core is being tested during this subtest. The label of the active port will be assigned to that current subtest execution. This will be the 'active' vector label. The common or clock labels will be attached to this subtest in their entirety. These common or clock sequences are called "supporting" vector labels.

The new port based vectors will enjoy the memory utilization improvement created by vector compression. This means when a series of vectors are identical, a single vector will be used in the vector memory, with a repeat value. When the individual vectors are a subset of the full device, the likelihood of a series of vectors having no changes may be vastly increased. This would generally be a natural result of the porting process. The vector compression may not necessarily be a part of this tool. It may instead simply be a positive result.

During this step, the analysis may include checking the vectors in the active vector label for duplication of vectors in subsequent vectors. If the same vector is repeated two or more times, for every change in content, the port may be a candidate for modifications in period execution time. Such vector labels should be flagged for the user to decide if period modifications may be desired in future. The user will use this information, first to select subtest pairings, then to create more efficient tests by using longer periods for the port.

The entire test sequence may be evaluated in this way, leaving the newly defined 'active' labels with the appropriate subtest. In some cases, it may be possible that both independent ports have activity within the subtest labels. These vector sequences may then need to remain together in the subtest, but still in independent port labels. Subsequent steps may improve the efficiency of these vectors, if the ports are maintained. If the tool finds that much of the vector sequence is inactive, the tool can suggest to the user that the vector set be broken up into separate subtests. Moreover, these vector labels may be separated for parallel operation. Now the individual subtests may have only the changing, active port assigned to it. The serial subtest may now have been broken up to independent core subtests (see FIGS. 8, 9 and 10). If clock or common pin ports vector sequences were found, these may be paired with the active vector sequences for execution. For an ATE such as the Agilent 93000, vector labels for a port environment are defined as multiport bursts. Multiport bursts are arrays of per-port vector labels that will be executed in parallel. For this step of building still serial test operation in a ported environment, vector execution arrays can be built for each subtest. The vector sequence array will include vector sequence labels for the active port, any supporting ports, and a default behavior for the inactive port. An ATE such as the Agilent 93000 may call these default behaviors 'break vectors.' This can conclude the test creation process, if parallel execution is not desired but only the efficiencies of period length and data compression are of interest.

Now that the subtests have been provided with only the active vector sequence, the resulting test sequence should be run on the device to ensure that the test still operates correctly. Any issues with test execution must be corrected at this time. If the tests will not run with only the active and supporting vector sequences in place, then further test speed improvements will be of no value. If the tests do run, with user modifications, the test is ready to create parallel subtests. This phase test sequence should be kept in the test sequence to act as a backup serial test strategy. It will be useful in debug and perhaps in production.

Before port vector sequences from different points in the test sequence can be combined, the supporting vectors need to be qualified for each active port. The analysis continues on the various supporting vector sequence. For clock pins, either the clocks are only defined as default clocking edges, or the vector definitions are likely to be the same for all subtests. The supporting vectors of interest are those for common pins, such as reset, interrupt, hold, and other general control lines. Each supporting vector sequence is compared to subsequent supporting vector sequences. Anytime a match occurs for the entire vector sequence, the matching supporting vector sequence is removed in favor of the previously defined sequence. The name of the previously defined sequence is defined to partner with the new active vector sequence name. Often, the supporting vector sequences will repeat throughout the test sequence, allowing parallel testing to be accomplished. If the common pins have no common behavior for both cores, it may be unlikely that the parallel execution will be allowed. For example, if one pin is in state "1" for port A, and state "0" for port B, it may then be a selector, i.e., selection criterium, that will not allow parallel operation.

The electronic stimuli or vectors determined to be used in parallel will be combined in multi-port vector definitions. If many vector sets are used on the original test, these will be brought to the new multi-port vector set in the same order. In some embodiments of ATE (as for example, for the Agilent 93000™ automated test equipment available from the assignee of the present invention, Agilent Technologies, Inc., Palo Alto, Calif. USA) the specifications and vector sequences (electrical/digital stimuli and responses) may be defined based on the individual subtests in the overall test sequence.

For digital subtests, the vectors brought from the original subtests or test portions may be joined into a multiport burst, i.e., the combination or matrix of one or more vector labels for one or more ports, where the port vector labels are joined. For mixed analog tests, the individual analog subtests maybe combined with functional subtests, or other mixed analog subtests with independent analog instrumentation. Each individual subtest in the test flow, for the 93000 a test suite (i.e., a test suite is substantially the same as a subtest as this term is used herein), will be modified to test multiple ports. The test suites from each device will be joined into a single test suite. If this is done simply in the order of the original subtest, the parallel execution of vectors may not improve the efficiency. For example, a very long memory subtest, if combined with a quick digital subtest, will be less efficient than joining it with a long subtest. For this reason, the tool hereof may assess the time of executions (see "Estimated Time", Table 1, infra), and make suggestions for one or more appropriate unions of subtests or test portions. User control may be desired over this process, as some subtests may not be taken out of sequence. However, either to assist in or improve the computer tool abilities to appropriately analyze and perform the steps of the process, a test flow directive could be added to define subtests, i.e., test suites that require certain ordering in the original test flow.

The next steps in determining more particularly how to assign the devices, pins and ports will likely include some analysis of the pre-existing serial device test to determine appropriate parallel test opportunities from the standpoint of timing. Opportunities of, for example, combining the longest test sequences of each separately identifiable test vector portions will be looked for to achieve maximum efficiency. The device tests (overall device test and subtests) herein may generally be defined by a combination of test flow, and individual subtest setups and results analysis. To merge or join together two different pre-existing device subtests or test portions from the pre-existing serial test, into a resulting device test with some parallel executions, decisions should be made on how best to combine the various test activities. In the case of parallel or concurrent testing of two or more sub-parts, now enabled by definitions into multiple ports, the subtests and/or vector code portions may preferably be combined in the most time efficient manner. This may involve a combination of user input, and automatic analysis. An automated test development tool (which may be a part of a more comprehensive test development tool) may be used to show the execution time consideration of each subtest or other subdivided code or vector portion. The user may then be involved to ensure the behaviors of all of the sub-parts (the sub-parts of any of the overall combined IC, SOC or MCM-type devices) are appropriately considered and the desired test strategy would then be met.

When a resulting device test with one or more parallel execution portions may be desired for the overall device resulting from the combination of two or more pre-existing subtests or test portions of the original serial test, the process may include creation of one or more overall device subtests or other test portions that execute the corresponding pre-existing subtests or portions of the subtests, or other test portions concurrently. Thus, if a pre-existing serial test, e.g. test 500 of FIG. 5, has two or more subtests, then a subtest, e.g. subtest 503 (or subtest 504, or both) of the final overall test 500 as in FIG. 5, may thus be created to include two or more subtests or portions of subtests from the pre-existing device serial test. Such conversions will be described further below.

Oftentimes, after the initial vector analysis and pin grouping definition, and after or together with the port assignments step(s), a next step to create a parallel execution combination device test out of a pre-existing serial device test, may be to perform an optional strategic timing analysis to determine optimal pairing(s) for parallel execution of pre-existing subtests or other test portions (e.g., newly separately defined vector and/or pin groupings) taken from the pre-existing serial device test. A desirable aspect of joining two or more pre-existing subtests or other test portions for the fastest possible combination device test execution time is to join similar test time subtests of/from the pre-existing serial test corresponding to respective two or more cores or sub-parts to operate in parallel in the combination, overall test. This should be done without affecting the appropriate behavior for either the sub-part or the resultant/combination device. The first consideration, the evaluation, can be handled manually or substantially automatically (e.g., by computer program as a part of the development tool) by the application of algorithms to determine the test execution time of each of the subtests or test portions of the pre-existing device tests. The second consideration, i.e., the actual parallel joining of subtests or test portions may generally be performed by a test engineer or by computer algorithm. Note, herein, reference to a subtest categorically includes any definable or identifiable test portion (e.g., code portion, vector pattern, etc.), and reference to test portion categorically includes the definition of a subtest (i.e., within the respective categories thereof).

Automatic analysis of the test time of the existing subtests or test portions may vastly improve a user's manual process. The overall execution time of the overall test flow can be automatically predicted or determined primarily by evaluation of the following estimated times: the overhead of timing/level specification changes; the digital sequencer time based upon the total vector count per test multiplied by vector period; and analysis of analog results, i.e., vector count multiplied times the period of operation. Unpredictable elements may be more difficult to estimate, such as any loop times. To choose a more desirable, i.e., more efficient combination, the tool may review the above issues, and then make suggestions of efficient combinations. Any user-defined sequence dependent tests or test portions may be programmed to be respected. After analysis, the tool may be adapted to show the suggested combinations in a spreadsheet-like or other tabular (or even non-tabular) presentation of corresponding times as shown, for example in the following table, Table 1, as set forth below. A supplemental or alternative, more manual process of actually running the pre-existing overall test on a DUT and collecting actual execution times for each subtest, and store these subtest times filed by subtest. These empirically determined test times may be used instead of the computer estimated times or may merely be used to adjust the same, if computer times are generated at all. The timing analysis may then include inserting such subtest times into a spreadsheet table (substituting actual run times for the estimated test times shown below), such as in Table 1 (below) separated by sub-device or sub-part with recommended execution pairs suggested.

TABLE 1

| COMBINE X | original sub-test name | Estimated Time |
|---|---|---|
| | Device A (-- Port A) | |
| R | DCA_nandtree | 70.532 |
| S | DCA_init | 70.43 |
| T and ↓ | DCA_mem | 30.422 |
| T | DCA_freq | 20.304 |
| | STOP_TEST | 11.956 |
| | Device B (-- Port B) | |
| R | DCB_i_o | 69.926 |
| T | DCB_mem | 50.757 |
| S | DCB_init | 41.348 |
| | DCB_freq | 31.53 |
| | STOP_TEST | 10.46 |

The user/operator may then be able to select or reject the combinations suggested by the computer tool. The user may thus also be provided with the capability to assign and/or reassign combinations (e.g., if no computerized timing analysis is performed). As shown, the subtests or test portions may have or be assigned names like "DCA_nandtree"; "DCB_i_o"; "DCA_init"; "DCB_mem"; "DCA_freq" and/ or may be of many other forms, and the subtests may be identified, i.e., sorted or filtered by sub-device/sub-part and/or port name which may also be used in the subtest name, see the DCA and DCB designations (representing the respective sub-parts, i.e., devices A and B, more particularly here, digital core A and digital core B). These sub-part designators may then also generally represent the port name to which the device is to be assigned. The table shows the expected or empirically determined or adjusted test time for each subtest, as shown. Such a table could also show other information such as the timing/level setups and vector count with or in lieu of the expected test time. Any unpredictable sequencer behavior, such as waits, loops, etc. may be discounted or otherwise accounted for (as described above) in the timing comparisons.

As shown in the exemplary Table 1, there are three suggested example combinations; namely, the "DCA_nandtree" subtest from or as associated with the Device A/Port A to be combined with the "DCB_i_o" subtest of Device B/Port B (each shown with a variable "R" for the combination); "DCA_init" from Device A with "DCB_init" from Device B (variable "S"); and both of "DCA_mem" and "DCA_freq" from Device A with "DCB_mem" from Device B (variable "T"). Though not shown in Table 1, still further combinations of subtests may be suggested and then ultimately made; e.g., all or substantially all of the subtests of one pre-existing serial device test combined with at least one (or more) subtests also from within that same pre-existing serial device test. Alternatively also, it may also be that no combination may-be suggested as is shown for the "DCB_freq" subtest in Table 1. This situation will also be shown and described relative to the flow charts of FIG. 6, below. A caveat on the recommendations as shown in Table 1 is that the supporting vector labels run in either case for either port, e.g. a three port scenario, should make sure that the common pins get applied in both of the now separate new cases, as will be described below.

The user/operator may then approve the pairing suggestions, or may adjust the pairings as they make sense for the particular DUT. When the selections are made that most closely match in run time, the new vector labels will be created in the form of multiple port vector sequence arrays, which may also be referred to as multiport bursts herein, as they are called in the nomenclature of the Agilent 93000™ automated test equipment described elsewhere herein.

In many embodiments, after selection of the new combinations of tests (i.e., usually when the user has approved the correct combinations), the development tool may be adapted to or made adapted to automatically or otherwise create the combination specs and vectors required for the new individual subtests of the new overall device test with parallel parts. Then it may actually write conjoined testmethod execution instructions. In a more particular example of what the tool may do to accomplish this, two (or more) subtests may be automatically (e.g., by computerized tool) combined (or suggested to be combined as shown in Table 1, e.g.) using a sequence of steps; such as:

Creation of a new test flow, with names representing the different cores/sub-parts.
Creation of new individual subtest instructions to execute the individual subtests.
Combination of basic data setups.
Configurations
levels*
timing*
analog setups
Combination of timing and vector sets from each-device test to new multiple port setups.
Creation of combination timing specs*
Final debug and user customization—often a manual process.

* As will be described further below, these asterisk marked steps may be codependent on individual subtest combination(s) in particular ATE systems such as for the Agilent 93000™ ATE (described further below).

Figure 6:
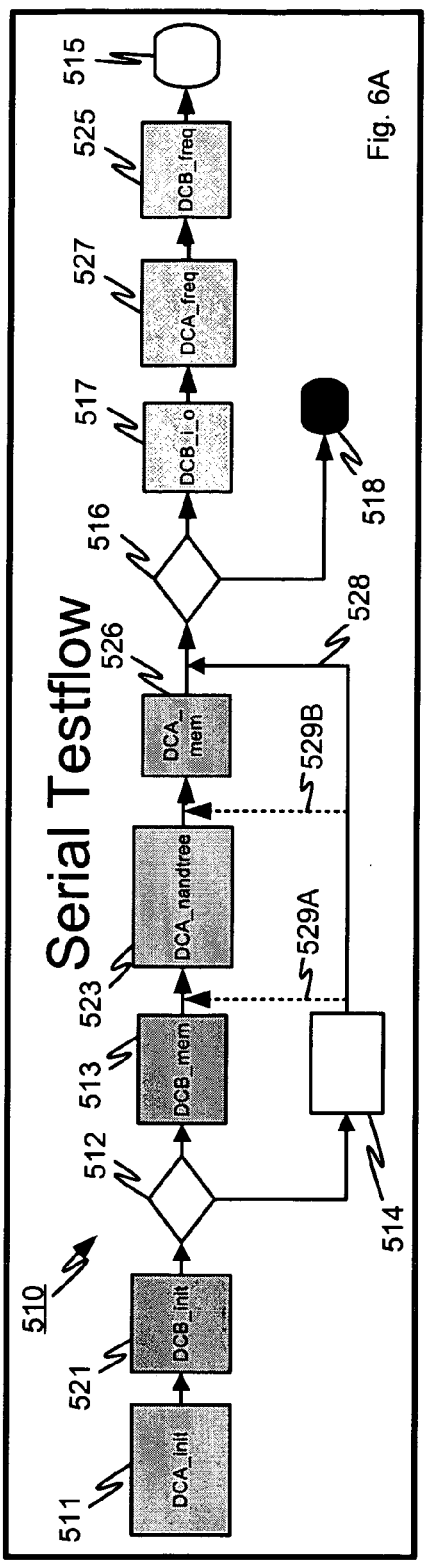
FIG. 6 is a set of flowcharts, including FIGS. 6A and 6B, respectively depicting a previously existing serial testflow and a combination reconfiguration testflow made therefrom.
Figure 6:
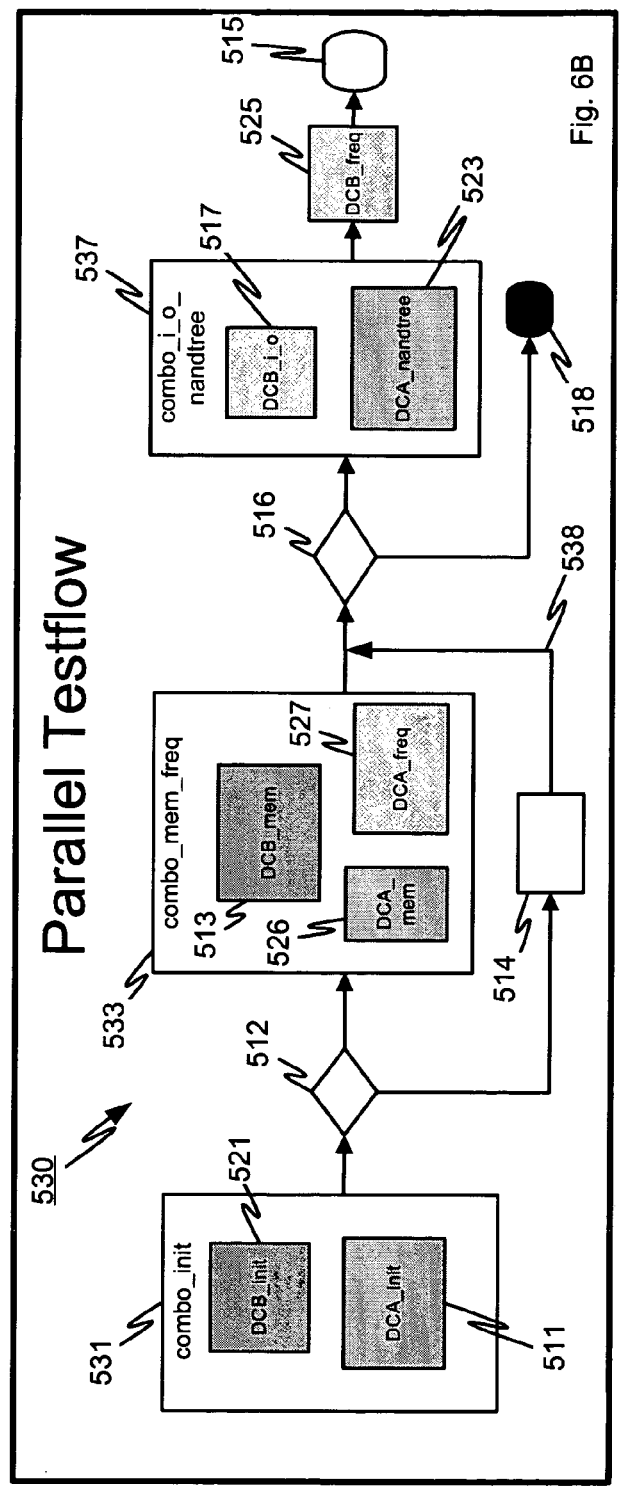

The newly reconfigured test flow, i.e., the reconfigured parallel device test testflow will be made up of new subtests created by combining the test portions from the pre-existing serial device test that are selected to be combined and run in parallel. The combination(s) test portions may occur during the creation of a completely new testflow using a testflow development tool (i.e., software/hardware for creating the test program); and/or, the combination may occur generally as shown in FIG. 6 which is described in further detail below. In one embodiment (see FIG. 6 description below), the user/operator or tool may select to duplicate the original, pre-existing test flow as the starting point. The development tool hereof may then be used to capture an original serial test, as by, e.g., making a copy of that original testflow or test sequence as an alternate path and thus create a new testflow. Or the tool may simply use that original testflow and rename it to or with a new name reflecting the pre-existing serial test as it is newly reconfigured. This pre-existing serial test flow (whether the duplicate or original) as used in creation of the new flow may also be called the base testflow. The overall test execution order will then be substantially dictated by, as it comes from this user selected base test flow (though it may be that any part or all of this order might still be editable). This would in many, but not necessarily all, cases be opposed to the use of a user interface to define the execution order, such as those user interfaces which use computerized test development selection charts in pre-existing test development tools. Note, if the original is copied or duplicated, one flowpath may remain active as the original serial testflow to provide a fall back testflow for use in debugging, and/or verification.

Next, the subtests existing in the base test flow may be renamed to reflect the new combined subtests or test portions representative thereof (though this may not be necessary, as the subtests or test portions may still be used to test only that separately identifiable sub-part (e.g., device, logic, circuitry or core), or even if combined with a subtest or test portion from the other sub-part, the pre-existing subtest name or names might still be sufficiently distinctive or even still sufficiently reflective of the new combined subtest even in the new reconfigured device test). Then, after the base test flow is updated with the new subtest names, if this step is so performed, the user may be able to make any adjustments to the test flow as desirable or perhaps necessary. Note, the new flowpath may have one or many subtests or test portions removed, as port activities are defined to execute in parallel as defined by the user using the vector analysis. The actual combination of the subtests (see Table 1) may take place at this point (before, during or after) the creation of the base testflow and the naming of the new subtests. Indeed, the new subtests, when these are combinations of subtests or test portions from each of the separately identifiably and/or separately testable devices or cores, these may be appropriately newly named in a manner reflecting the combination as shown in FIG. 6 (see for example the subtest combinations in FIG. 6B with the new test names "combo_init"; "combo_mem_freq" and "combo_i_o_nandtree" which are reflective of the combinations of the respective subtests "DCA_init" with "DCB_init"; and "DCA_mem" and "DCA_freq" with "DCB_mem"; and "DCA_nandtree" with "DCB_i_o").

The two views of FIG. 6 (FIGS. 6A and 6B) show how an automated (or at least semi-automated) process might work in an exemplary embodiment. In particular, an original, serial testflow, is used as is or duplicated as described above, and then the testflow to be used/converted may be denominated as what will here be referred to as the base testflow, here the originally, pre-existing serial testflow 510 (FIG. 6A). This may occur before, after or during the timing analysis (if so performed) exemplified by the results reported in Table 1, see above. Then, the subtests or test portions are combined in the manner either suggested by the tool hereof (as from Table 1, for example) or as assigned by the operator. Subtest names may be added/renamed here as well (before, during or after the actual subtest combination process). This testflow subtest combination part of the overall process may be the most manual, operator-involved part, because the new test strategy may be desired to be (or may have to be) changed based upon the combinations of subtests made or desired, the parallel subtest combinations and subtest sequence thus may and likely will need to be planned by the user.

More particularly, in reference to the exemplary, non-limiting embodiment of FIG. 6, note that the base testflow is taken from the serial testflow 510 (FIG. 6A), which here has eight example subtests or test portions 511, 521, 513, 523, 526, 517, 527 and 525 (here named "DCA_init"; "DCB_init"; "DCB_mem"; "DCA_nandtree"; "DCA_mem"; "DCB_i_o"; "DCA_freq"; and "DCB_freq"; respectively). Note again that subtests as used here may be previously non-subdivided portions of an overall, pre-existing serial test which may, as for example after a vector analysis (or the like) be separately identifiable, and thus treated as separate subtests hereafter. The serial testflow 510 also has two decision diamonds 512 and 516 and thus two subordinate flow elements 514 and 518 and a flow stop element 515. Then, in an ultimate parallel combination of subtest elements or test portions as suggested/adopted in FIG. 6B, a first subtest or test portion element 531 may have been created (with the new name "combo_init") from a combination of the respective subtest elements or test portions 511 ("DCA_init") and 521 ("DCB_init"). In the example shown here, the "_init" test elements 511 and 521 may be initialization test elements and as such may thus necessarily be in the first or initial test positions relative to each of the sub-parts, e.g., cores/sub-devices, they are associated with. Here, then, the two initialization programs are coupled together in the first subtest element 531 in the combination testflow of FIG. 6B. However, it may alternatively be noted that in some embodiments not requiring initialization programs, and eventhough the serial testflow 510 was established as the base testflow, the first subtest element 511 thereof, or similarly the second test element 521, may neither be determined to remain in the first testflow position and either or both may rather moved to a different disposition other than as shown here. And, similarly, a subtest element in a second or other subsequent portion of the base serial testflow after the decision diamond 512; may instead or additionally be moved to a position prior to the decision diamond 512 as into the first combined subtest element 531 of the combined parallel testflow 530.

Rather, as shown, the first and second subtest elements 511 ("DCA_init") and 521 ("DCB_init") have been retained in the first combined testflow position 531 (FIG. 6B) as a part of the newly created subtest element 531 (named "combo_init" in the example of FIG. 6B). Similarly, the next subtest 513 has been retained in the next combined subtest 533 (named "combo_mem_freq"). Also, the second new subtest element 533 also has shown combined therein the two subtest elements 526 and 527 from the second and third parts of the serial testflow 510 (from FIG. 6A). The third new test element 537 (named "combo_i_o_nandtree") is a combination of the subtest elements 517 and 523 ("DCB_i_o" and "DCA_nandtree"; respectively from the serial testflow 510). Note, these combinations mirror those suggested in Table 1 for illustrative purposes, but not for any limitation thereof. Other combinations of subtests are possible, in the alternative.

The decision diamonds 512 and 516 from the base testflow 510 remain in the final, combined parallel testflow 530 (FIG. 6B), if so desired. Similarly, the stop element 515 remains as do the subordinate testflow elements 514 and 518, also if desired. The operator may be allowed to remove or move any such element as so desired. Note, the subordinate test elements 514 and 518 might represent subtest elements or other functional elements, and they may represent a substantially similar sort of element intended to jump the second, and perhaps also the third subtest element, in FIG. 6A, e.g., skipping elements 513 and 523 and 526 using the return flow line 528. An interesting issue is suggested here by the alternative return flows 529A and 529B (dashed lines) in. FIG. 6A such that if either of the optionally presented return flow 529A or 529B is the desired return in testflow 510 (FIG. 6A); then, a question might arise as to whether the combination of subtest element 533 makes sense with the inclusion of subtest elements 526 and/or 527 therein. More particularly, would the combination subtest 533 be desirable with the subordinate flow return 538 as shown in FIG. 6B also skipping the previously not skipped subtest element 526 and/or element 527? Perhaps more interestingly might be the question of the suggested combination of subtest element 523 ("DCA_nandtree") in the new third combination test element 537 after the control element 516 and thus after the return line 538 from the subsidiary testflow including the subtest element 514. Thus, this may suggest a situation in which it may be desirable to overrule the initial suggestions of the automated tool hereof which in developing its suggestions (see Table 1) may not have analyzed these flow scenarios (though, it could be that the tool is made to make these analyses as well). Note further, the element 518 could represent an alternative stop or other functional element.

The next step, after the subtests are selected for combination (Table 1) and organized for desired sequencing (FIG. 6) for the most time efficient execution, is to then actually create the new subtests for the new at least partially parallelly executable overall device test. As mentioned above, though combined in combination subtests (e.g., 531, 533 and/or 537 in FIG. 6B), the original subtests from the previously serial testflow (e.g., base testflow 510; FIG. 6A) may be desired to retain their original statures (i.e., constructs or assemblages) to a large (or perhaps only a small) degree and thus continue to operate or be adapted to operate substantially independently (e.g., via an independent port, see below) of the other subtest(s) combined therewith. In this way, the original subtest may continue to be run for the particular sub-part, e.g., sub-device or core which itself may retain most if not all of its original character but for having been incorporated onto a common substrate with another one or more other sub-parts. One way in which to accomplish this might be to define such a sub-part and a corresponding subtest or test portion to a particular port in a multi-port environment, as for example is provided by conventional ATEs. Thus, in one example, in a combination overall device 10 or 1000, a sub-device or sub-part A 11*a* or 1100*a* may be defined to a port A 18*a* (see FIG. 4, e.g.) and a sub-device or sub-part B 11*b* or 1100*b* may be defined to a separate port B (see also this sort of ported or port-wise separation/identification of subtests in Table 1). Then, the subtests or test portions for sub-part A might be made to run concurrently or in parallel with those subtests of sub-part B. The resulting new test sequence 530 may now have significantly less individual subtests. After the new parallel test is operational, the user will have already vastly improved the overall test speed.

In some embodiments (as for example, with the Agilent 93000™ ATE, available from the assignee of the present invention, Agilent Technologies, Inc., Palo Alto, Calif.), an actual parallel test may be accomplished with a form called testmethods (note, a testmethod here is a particular computer implemented program or set of instructions to particularly run a particular test or subtest; as contrasted with any sort of less particularized method for performing any task, including methods for testing or setting up a test for a device/DUT which may include elements or steps outside of and/or separate from a computer or computer implementation). Such testmethods, as used here, may be C++ or like computer programs that are compiled to create and/or run or execute the actual subtests. In many cases, the original subtests or test portions may be in a simpler or perhaps simply in a different computer format. For these, the transition may be more complicated. Testmethods are usually customized computer programs which perform or run instructions which are in the setups and/or specifications, and thus execute each step in or relative to a particular subtest. They are used when the test strategy may be more complex, for example digital and analog tests mixed in a single subtest. Though often associated with the respective subtests, it is possible for a testmethod to be associated with more than one part, i.e., subtest or other portion of a testflow. Testmethods may be used to control the overall test sequence including initiating the waveforms and controlling the voltage levels and timings of each subtest. The testmethod(s) also receive the response signals and perform the analysis thereof to determine the passage or failure of the subtest(s) or test portions. Parameters (e.g., as signal or waveform vectors) are passed in and out of the testmethods to interact with the DUT and provide responses thereto. Constructs are the format or framework within which the testmethods may operate. In many situations, libraries for testmethods may already be pre-existent or may be newly created as desired. The user may search for appropriate test libraries. The tool hereof will in some embodiments be adapted to suggest testmethods by analysis of the pre-existing subtests or test portions. For example, if two straight digital subtests are combined, the tool may then be adapted to automatically find in a library, or create an appropriate testmethod. If analog testmethods are combined with digital, the tool hereof may then be adapted to write a new testmethod, suggesting to the user the required constructs, i.e., the framework for the testmethods to be created. In many cases, this will be substantially the last stage of the test development using the tool hereof, i.e., when the testmethods are found in a library or created. In this last phase (i.e., the combination of the setups/specifications and creation or at least matching of appropriate testmethods), the user will usually also have an opportunity to improve and/or often will want to modify the suggested testmethod, test execution and results analysis.

Figure 7:
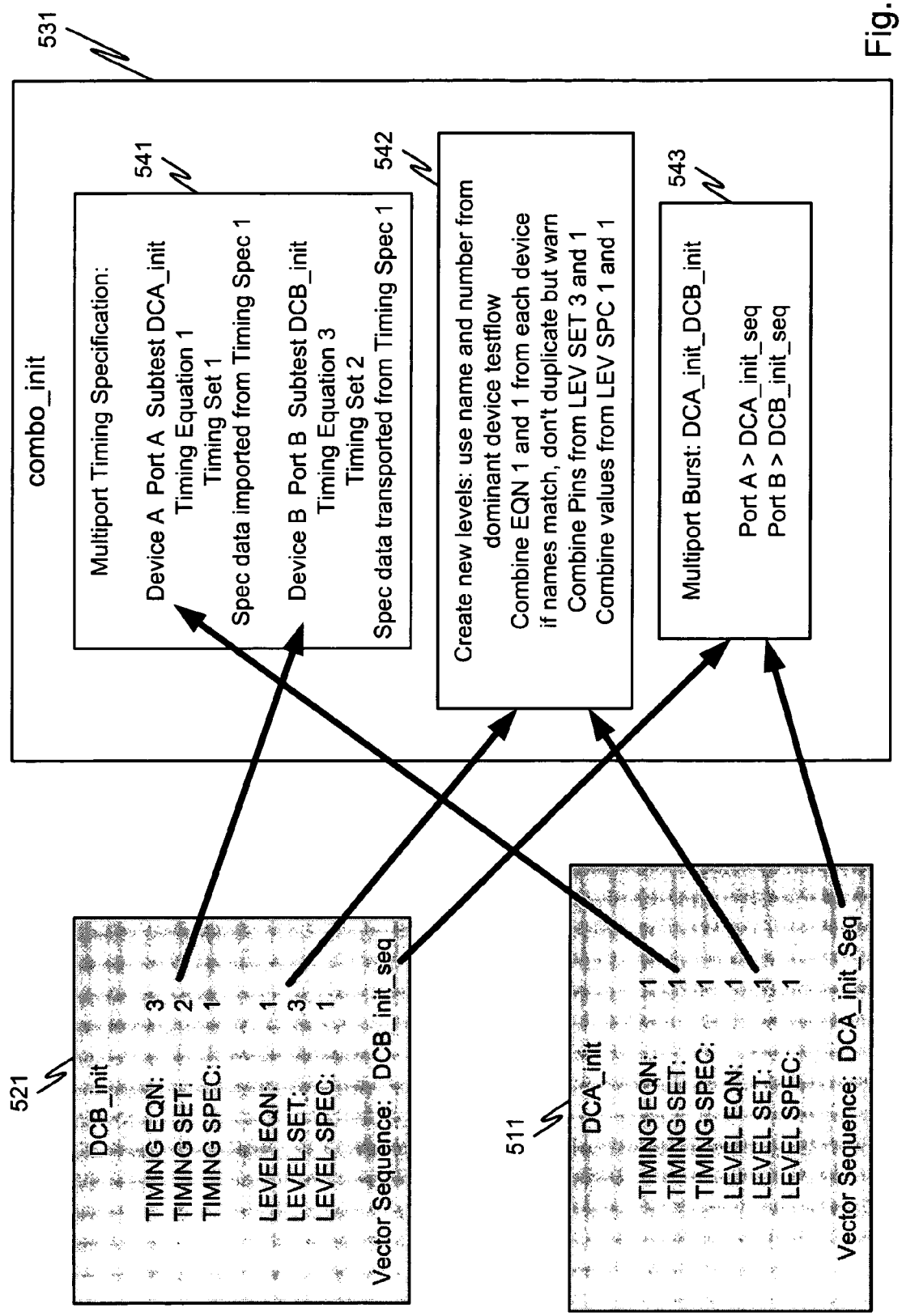
FIG. 7 is a relational diagram depicting a conversion of an exemplary two of the previously serially existing subtests to a final combinational subtest.

However, usually prior to such testmethod creation/selection, yet after the test protocol and subtests are created, the pre-existent subtest setups should be combined (see description relative to FIG. 7, below). These combinations are determined by the previously evaluate vector sequences and the individual subtests. All steps past this point depend to a greater or lesser degree on the combined subtest. In the combination of two (or more) subtests, the setup selections of both original subtests may be combined in the form of new constructs for a newly combined parallel subtest. Once the subtest elements are combined, the setup elements may in some embodiments, be automatically combined. If the user decides that these subtest elements may be run together, then the setups don't have to be re-done. In any event, most of the original timing setups can be combined directly—with each port having an independent setup. These may be independent of the subtest utilization. Then, the set of port setups to be used for the combination of subtests, may be called or selected based on the content of the original subtest. For example, one port may have several equation options. These may be translated directly, simply by adding a definition statement identifying the port name. The specifications to be used may identify the port equations to be used, and the value of the variables in the equations. Voltage Levels may be handled in a similar manner (i.e., voltage levels may also need to be combined relative to the subtest pairing as well); however, in some embodiments, these levels may not be ported, i.e., the levels may instead be defined independent of the ports (see e.g., the 93000™ ATE introduced above), and thus apply to the entire device. Without port definitions, the ATE (e.g., an Agilent 93000) may need to create more level definitions that properly combine the various levels. Even so, the combining of the pins into single level equations may be better adapted across the device given information about how the subtests will be combined to make new, parallel subtests.

The combination of port based timing definitions and vector (electronic stimuli patterns and/or waveforms) sequences should also correspond with the port based specifications to identify which definitions go with which port. These are constructs likely not used in the original, non-ported test, and would thus be created during the creation of the parallel port definitions. When devices are tested in parallel, the timing and vectors will then be defined for parallel operation. The multiple port timing specifications determine how to combine timing equations and waveforms for the two (or more) sub-parts. The multiple port vectors combine the digital vectors to be applied to each device. Both should be combined in consideration of how the new subtest is pulled together from the original subtests. Note, in some embodiments, timing and level settings may be left in the original form, since the timing may not be required to be port based, as for example in ATEs such as the Agilent 93000.

Timing of the original serial test defined independently or by groups may here be assigned to all pins on the device by a set of equation, wavetable and specification definitions assigned by name and number. They may all have the same base period. These definitions can be changed subtest to subtest. With a powerful port definition capability, the desired timing can be defined by port and applied in combination with other ports. This capability may allow the original subtest timing settings to be mixed and matched as the subtest pairing requires. Equations, timing sets, and wavetables may be assigned on a port basis, with new names and numbers. A cross-reference can be maintained between the original names and numbers and the new ones. The pairing of these timing definitions may then be defined to correspond to the requirements of the new combined subtests. The combination of these port based timing definitions may be defined as the multiport timing specification. These will be subtest combination dependent, but may be used repeatedly throughout the test sequence.

A possible first step in the creating of the new data setups for the new combination subtests (e.g., subtests 531, 533 and/or 537 in FIG. 6B), may be to add the ports to the original pin configurations for the device, and then assign ATE ports for each. The port assignments were determined when the vector, i.e. stimulus/response, patterns were evaluated as the general first step hereof. As a result thereof, there will have been ports defined for the common pins, and for each set of independent pins. As described herein, both (or more) of the independently identifiable sub-parts may have been incorporated into/onto the combination complex device with subtest and sub-part definitions of corresponding pin configurations that may be used to define which test port is used for or assigned to which/each device pin.

The simple basis of ported testing is defining ports containing the digital test resources to be applied to each core/original device to be subjected to the particular subtest. Test resources are generically the physical features, the hardware of the tester, i.e., the ATE, which are the actual parts to which the pins or pads of the DUT physically/electrically connect and thus through which the ATE electrically communicates with the DUT. The ports are the re-definable electrical definitions of the groups of resources which correspond to each other for particular purposes, as for example, a group of resources relative to a particular test, or relative to a particular core or IC or SOC or MCM part or sub-part. In the simple case, each sub-part, i.e., core/sub-device, will be defined to a separate ATE port. In some cases, signals to the overall combined device substrate may be routed simultaneously to both sub-parts, e.g., cores/devices, as they may have common stimulus requirements. These signals, particularly clocks, e.g., keep-alive clocks, may thus be defined to be communicated to and through one or more separate ports (i.e., ports separate from the ports to which either of the sub-devices/cores is primarily defined) which are defined/assigned to communicate with the common pins of all of the corresponding sub-parts. This separation then allows independent control of these one or more separate ports; control which is independent of the operations occurring on and through the primary overall device ports.

For digital subtests, the vectors separated into ports from the original subtests may be joined into a combination of labels for two or more ports, i.e., vectors at certain times are defined by labels, which are groups or sets of vectors. The labels are then assigned to/with ports with/via the respective port names. The labels may be collected into groups, sometimes called bursts (as in the Agilent 93000 ATE referred to/described herein elsewhere). Then, each subtest may then contain a pointer to point to one or more particular label(s) or group(s) of label(s) (i.e., burst(s)). In the combination subtest created from, and having disposed therein a combination of two or more previously extant subtests from the original serial test, would then likely have two or more different pointers to point to two or more different labels or groups of labels. It is possible that the two or more previously separate subtests, after combined may provide a single pointer-pointing to a single label or group/burst of labels. This combination, though pointing in different directions, may nonetheless yield a combined single test sequence.

Note, herein described is a process/tool in which ports may be defined first, often as a direct result of the sub-parts, i.e., cores/sub-devices, which are and have been parts of the DUT, as a consequence of the pin pattern defined by the cores/sub-devices on the DUT. As mentioned some common pins are also formed in such a default situation. Then, the primary steps of the process/tool hereof may be entered into, i.e., the best timings for combinations in a combined flow is first performed/performable (note, preliminary port definition may also in some alternatives be a part of the primary process/tool hereof). Then, in some embodiments, port definitions may be altered or adjusted, or simply defined for the first time (if not, as may be desired in certain situations, previously so defined). The concept may be that after the timing decisions have been made as to which subtests to combine, it may in certain situations prove profitable to then determine port definitions. Otherwise, then (or perhaps substantially simultaneously therewith), the other automated or semi-automated steps may be performed such as the subtest set-ups. In some other embodiments, it may be that certain setup steps and/or even the testmethod establishment (see below) may be performed before the port definitions or final port adjustments are completed.

In the combination of subtest setups, other than the port definition and/or vector issues discussed hereabove, the combination of the voltage levels and timing to be used in the new overall parallel device test may be more straightforward relative to vector combinations, as the port definitions may have less influence. As introduced briefly above, it may be common that the levels will need no port definitions. It may still be that such levels may be defined for each port, however, if they cannot (or simply desired not) be port based, any different level specifications (specs) from the separately identifiable sub-parts will still be combined appropriately for the sub-test combination. Voltage levels in the level tests generally do not have port specific definitions (though in some alternative embodiments these, like any test parameter, could also be port specific). Similarly, timing may be straightforwardly defined, although, this will likely be port-based; i.e., timing from the original serial testflow for a first sub-part (e.g., device A) may be used for and thus define the timing for the corresponding port for that sub-part (e.g., port A). The respective pre-existent timings for the other sub-part(s) (e.g., device B, etc.) may then similarly be used/defined for the ports of such sub-part(s) (e.g., port B, etc.). Timing may then create a powerful period control in/for the multiple-port specification. Timing may include timing specifications, edges and/or equations and yet all of these may be transposed to the new port definitions/assignments. New timing issues may also be addressed, as for example discrepancies due to incompatible periods, required keep-alive clocks, and/or other critical timing concerns. Numbers are often used to identify each element of the timing. Since the timing settings may be linked to the ports, all such numbers may remain the same, except the multiport timing specification. The timing equations and waveforms from the respective sub-parts may also be translated directly into port based timing. The timing specifications from each individual subtest may be combined into a multiple port timing specification as defined by/in the new combinational subtests. Since the period and timing of the new ports are the same as the original device, the port designation simply needs to be added to the overall timing equations and waveforms.

The timing setups, i.e., specifications, for both (or more) of the separately-identifiable sub-part subtests or test portions may be combined in the form of a single, combined multi-port timing specification for the parallel test. Since independent period definition (i.e., independent for each port) is a prime benefit of a port based device test; then, the resultant combination timing specification may often be the most complex and important activity of the combination process. This resultant specification may have an individual setup for each port, the individual setup often being pulled or copied from the previously existing sub-part subtests. The resultant specification identifies the port with equation sets, wave tables, and specification values as shown in FIG. 7. The example in FIG. 7 (which may be applicable in, for example, the 93000™ ATE environment, inter alia) shows how this might be accomplished in a real system. Original, previously separate or otherwise separately identifiable subtests or test portions 511 and 521 from the previously serial testflow A 510 (see FIG. 6A) are exemplars which are being combined to a subsequent subtest 531 as described above (see FIG. 6B). To do so, a combined timing specification part 541 of the new subtest 531 will be created from the timing data from each of the previously separate subtests 511 and 521. Such timing data, though now combined in a new separate subtest specification 541 may nevertheless be kept separately defined to the respective ports A and B as shown in FIG. 7. As mentioned, the level information may not be port specific; and so, as shown in FIG. 7, a new level specification 542 may be created using the information of the previously separate subtests, but combined here without regard to port or sub-part (again, this could be port/sub-part specific also if for whatever reason discrete levels may be desired). Lastly, the vector sequences from each of the previously separate subtests 511 and 521 will be combined in a combined vector label or, as described above, a multi-port burst 543. When the subsequent tests are translated, reuse of earlier defined levels and timing when repeated, create new level and timing specs as needed. The settings inside the subtests may now reflect the appropriate combination for levels and timing.

Figure 11:
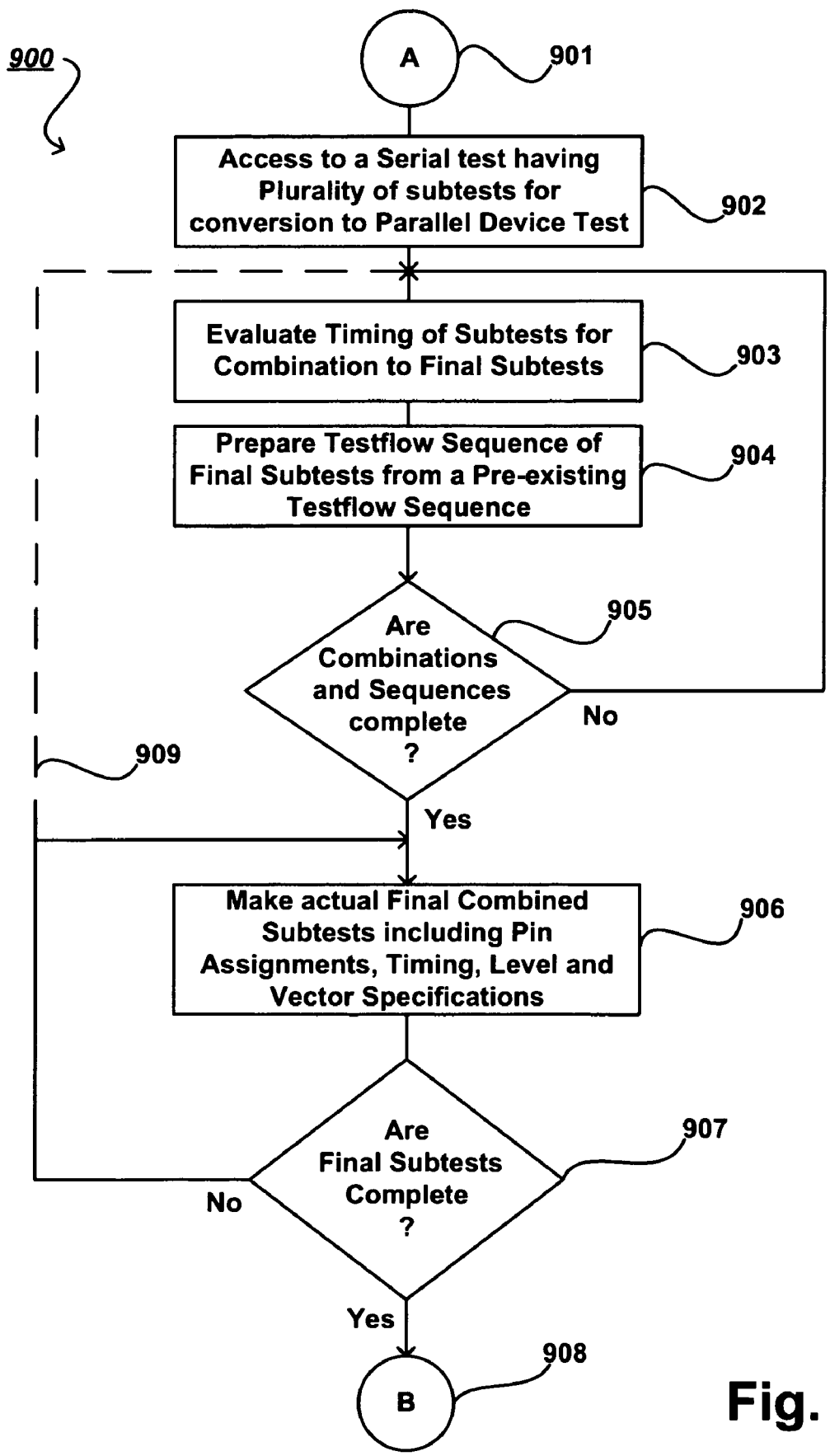
FIG. 11 is a flow chart depicting various steps of a method according to an exemplary embodiment of the present invention.

In FIG. 11, a summary general process 900 according to an exemplary embodiment is shown. More particularly, the summary process 900 shows a starting point arbitrarily marked A 901 with a corresponding ending point B 908. And, disposed therebetween several steps are shown. For example, a first step 902 may be the actual accessing of the priorly existing sub-part subtests from the pre-existing serial test. A next couple of steps are the initial timing evaluation 903 and testflow sequencing 904. These steps are described above, particularly in regard to the timing evaluation, see Table 1, and the testflow sequencing was described relative to FIG. 6. An optional iteration element 905 is next shown suggesting that the initial steps 903 and 904 may be run through one or more times (by computer and/or human operator) in order to determine good combination matchups and sequences for the overall end combination device testflow. Note, even though these are described as initial steps, they may alternatively and/or also be performed later in the process. An example of this is shown by the dashed line 909 which returns execution of the overall process to these otherwise initial steps even at the end of the process, if for example, it may be later determined that certain combinations and/or sequences may not be desirable for whatever reason. In any event, the other sort of sub-process also shown in FIG. 11 involves the actual subtest combination step(s) 906 with a similar sort of iterative element 907 which enables iteration for each individual final combined subtest created hereby and/or for review at any point in the detailed subtest combination process. Note, the step or steps for actually combining subtests may include new or reviewed pin assignments, timing, voltage level, vector planning (e.g., multi-port bursting) and/or other specifications (see FIG. 7 and associated descriptions). The start point A 901 need not be the overall test development starting point as there may be other steps also performed herebefore, and similarly, the endpoint B 908 need not necessarily be an overall endpoint, but rather a connection to any other suitable point in the test development process, and/or connection to the actual testing of the device(s).

Note, as a further part of the last two steps 906 and 907 of the process 900 of FIG. 11 may also be the actual testmethod generation, i.e., the actual computer programming to create the computer programs which will effect the stimuli generation and results analysis according to the specifications of each subtest. More particularly, in some embodiments, the last step of the overall process may be the creation of the final test execution environment, if this has not already been completed by or as a part of the completion of the previously described steps. In many cases, the combined subtest may have a testmethod already established in the ATE architecture (in most cases in the Agilent 93000™ ATE architecture). Even if not absolutely necessary, in the case of some default port subtests (testing all pins with the same setup), testmethod libraries will be selected. This will make it possible for the user to add port based testflow variables to help manage the flow, and characterize the test data.

A number of standard subtests may have existing libraries of testmethods. A standardized testmethod may be assigned to the combination subtest. Then the user may customize the testmethod to match the test strategy. Here are some examples:
  a) When all resultant parallel subtests are digital functional subtests (i.e., when there are no analog subtests to be run), then, the testmethod may execute one or more digital multiport bursts, and may then identify and log individual port failures.
  b) When there is an analog functional subtest combined with a digital functional subtest, then the testmethod may then use an appropriate start command to start all sequencers. Digital sequence will execute along with analog execution. Standard calculations and results are performed based upon the original analog and digital subtests.
  c) When the original subtest has a testmethod, the contents of the testmethod may be copied directly into a digital functional subtest testmethod, creating a customized testmethod.

The new testmethods from any of these or any other process may then be compiled. The user can then make modifications immediately, or in the debug phase.

In a primary embodiment then, a tool and/or method/process and/or system is made available wherein a first operation is provided for accessing/evaluating the vector pattern(s) of a pre-existing serial test, whether of subtests or separable test portions thereof to determine how to organize combinations thereof for the resultant overall test to ultimately have some parallel ported action. Then, the tool/process/system may provide for the actual combinations of compatible test portions or subtests, including the definitions of vectors, levels (voltage levels), and signal/waveform timing. A timing analysis may also be performed to assist in the determination of compatibility and actual combinations. Then, the resultant combined subtests have testmethods defined therefore, by new creation or by use of pre-existing testmethods from pre-existing libraries thereof. Pin/port definitions may be separate from this tool/process/system, or may be incorporated as an initial part thereof. In either case, the pin/port assignments may be performed before the timing analysis, before, during or after the subtest combinations, and/or before, during or after the testmethod establishment. A potentially desirable consequence is a feature which allows or provides for creating tests which test in parallel whenever possible, and/or may also take advantage of providing desirable, if not the best test times possible for the two (or more) sub-part cores/devices of the overall MCM/IC/device.

As described above, the present invention is adapted to facilitate automated test equipment functionality for testing integrated circuits. In this regard, some embodiments of the present invention may be construed as providing test systems for testing integrated circuits, and/or test set-up systems or testflow set-up tools therefor, with such systems being implemented in hardware, software, firmware, or a combination thereof. In a preferred embodiment, however, the test system and/or test set-up system or tool is implemented as a software package, which can be adaptable to run on different platforms and operating systems as shall be described further herein. In particular, a preferred embodiment of the test system and/or test set-up system, which comprises an ordered listing of executable instructions for implementing logical functions, can be embodied in a computer program and/or any computer-readable medium for use by or in connection with an instruction execution system, apparatus, or device, such as a computer-based system, processor-containing system, or other system that can fetch the instructions from the instruction execution system, apparatus, or device, and execute the instructions. In the context of this document, a "computer-readable medium" can be any means that can contain, store, communicate, propagate or transport the program for use by or in connection with the instruction execution system, apparatus, or device.

The computer program and/or computer readable medium can be, for example, but is not limited to, an electronic, magnetic, optical, electromagnetic, infrared, or semi-conductor system, apparatus, device, or propagation medium. More specific examples (a non-exhaustive list) of the computer-readable medium would include the following: an electrical connection (electronic) having one or more wires, a-portable computer diskette (magnetic), a random access memory (RAM) (magnetic), a read-only memory (ROM) (magnetic), an erasable, programmable, read-only memory (EPROM or Flash memory) (magnetic), an optical fiber (optical), and a portable compact disk read-only memory (CDROM) (optical). Note that the computer-readable medium could even be paper or another suitable medium upon which the program is printed, as the program can be electronically captured, via for instance, optical scanning of the paper or other medium, then compiled, interpreted, or otherwise processed in a suitable manner, if necessary, and then stored in a computer memory.

The figures (e.g., FIG. 1) illustrate a typical computer or processor-based system 22 which may facilitate control functionality of the test system 20 of the present invention. As shown in FIG. 1, a computer system 22 may generally include a processor and a memory with an operating system. Herein, the memory may be any combination of volatile and nonvolatile memory elements, such as random access memory or read only memory. The processor accepts instructions and data from memory over a local interface, such as a bus(es). The system also includes an input device (s) and an output device(s). Examples of input devices may include, but are not limited to, a serial port, a scanner, a local access network connection, keyboard, mouse or stylus, or the like. Examples of output devices may include, but are not limited to, a video display, a Universal Serial Bus, or a printer port. Generally, this system may run any of a number of different platforms and operating systems, including, but not limited to, HP-UX™, LINUX™, UNIX™, SUN SOLARIS™ or Microsoft Windows™ operating systems, inter alia. The test system 20 of the present invention may in some embodiments reside in the memory and be executed by the processor.

The flowcharts of FIGS. 5 and 6 show the functionality and operation of alternative implementations of the test system 20 depicted in FIGS. 1–4. In this regard, each block of the flowchart may represent a module segment or portion of code which comprises one or more executable instructions for implementing the specified logical function or functions. It should also be noted that the implementations of the functions noted in the various blocks are intended here to represent the sequential order of the testflow. The test nodes may in these instances be moved so that they may effectively occur out of the order depicted in FIGS. 5 and 6.

In FIG. 1, there is shown a user interface screen 23 which may be or provide access to the tool for programming the test and/or test signal generator (e.g., generator of the testflow) of and/or for use with the controller 22. The user interface screen 23 may be generated in high level software using a variety of graphical user interface techniques for entering and displaying data on personal computers and workstations. The capabilities of this invention could be invoked from a menu item or the like during multi-port test development. An option such as "Evaluate Timing of Pre-Existing Tests" could be present in the menu structure, or as a button on a dialog, and the search and evaluation would be performed when the button or menu is selected. Software links might be provided to correctly activate editing capabilities for the Multi-Port programming. The signal generator of the controller 22 is highly adaptable and able to generate a wide variety of complex signals including digitally modulated signals as well as traditional function generator signals including, e.g., sine and square waves. The signal generator may typically be interfaced to a personal computer or workstation, allowing for computer control according to selected parameters. Programming the controller and thereby also the signal generator may be done using a menu hierarchy containing a set of user interface screens that allows the user to control signal parameters in a logical and intuitive manner. A user interface screen 23 may then be used to select menu items from the menu structure or hierarchy that allows for programming the parameters of the test. Dialog buttons with or without pop-up windows may also be used. The various parameters may be entered numerically, using pull down menus, or any of variety of data entry techniques. The various dependencies among the parameters may be handled in the user interface to simplify programming. Alternatively, a set of software library functions may be provided to access the parameters of the controller 22 in an automated test system where limited or perhaps even no user/developer programming may be needed. The test program tool and resultant program(s) may be stored in memory on a computer, stored on disk, or any other computer readable medium. They may be part of a single piece of executable code, or they may be separate programs, or routines. Furthermore, they may be executed on the same computer, or they may be run on different pieces of hardware. The hardware implementing the test system shown in FIG. 1 may be a general purpose computing device coupled to the measurement hardware and executing executable code or it may include custom hardware, such as an application specific integrated circuit that integrates one or more of the functions shown.

After the testflow has been developed and established (de-bugged), then the overall test process can proceed. First, the IC, SOC or MCM under test will be connected to the ATE (if not done so previously, i.e., during test set-up), and the IC/SOC/MCM may be provided by the ATE with appropriate signals to facilitate testing, such as analog parameter testing, among others. Such signals may include, but are not limited to: one or more power signals; one or more clock signals; one or more reset signals; one or more critical signals, and; one or more test control signals, among others. Then, test data is received, such as by the ATE, with the data being received in any suitable manner, e.g., intermittently throughout the testing cycle, or after testing has been completed. The test parameters may then be evaluated to determine whether the integrated circuit is functioning as desired. If it is determined that the integrated circuit is not functioning as desired, the test results may be verified, such as by repeating at least some of the aforementioned process steps, and if the determination once again is made that the integrated circuit is not functioning as desired, the process may proceed to rejection of the integrated circuit. If, however, it is determined that the integrated circuit is functioning as desired, the process may terminate with a positive result. So provided, embodiments of the testing system 20 of the present invention may be or at least may provide part of an efficient and effective testing system which may improve some of the inherent strengths of conventional ATE, e.g., reduced costs, while providing potentially improved testflows, e.g., reduced testing set-up times.

Additionally, some embodiments of the present invention may be construed as providing computer readable media incorporating a computer program. In some embodiments, the computer readable medium includes a computer program for facilitating testing of and/or the setting-up of tests for an IC, SOC or MCM and incorporates computer code and/or logic configured to enable ATE to provide at least one test signal to the IC/SOC/MCM so that a response signal from the IC/SOC/MCM can be received by the ATE to measure at least one parameter communicated via a first pin or pad of the IC/SOC/MCM. Logic configured to enable the ATE to receive and/or evaluate the response signal and/or other data from the IC/SOC/MCM corresponding to the at least one parameter may also be provided.

Embodiments of the present invention may also be construed as providing methods for testing and/or setting up a test for an IC, SOC or MCM. In some embodiments, the IC/SOC/MCM includes at least a first pin or pad configured as a signal interface for components external to the IC/SOC/MCM, and adapted to communicate test signals relative to at least one parameter of the IC/SOC/MCM. A resulting test method/process may include-the steps of: electrically interconnecting the IC/SOC/MCM with the ATE; providing at least one stimulus from the ATE to the IC/SOC/MCM so that the test signals can provide for measuring at least one parameter of the IC/SOC/MCM; and the ATE receiving information corresponding to the at least one parameter presented by the IC/SOC/MCM.

The IC and/or SOC and/or MCM includes at least a first pin or pad disposed to electrically communicate with at least a portion of the ATE, with the first pin or pad being configured as a signal interface for components external to the IC/SOC/MCM. These may thus form systems for measuring a parameter of or communicated through a pin or pad of an IC/SOC/MCM. Preferably, such systems include automated test equipment (ATE) configured to electrically interconnect with the IC/SOC/MCM and to provide at least one signal to the IC and/or SOC and/or MCM. The IC and/or SOC and/or MCM is adapted to electrically communicate with the ATE so that, in response to receiving a test signal from the ATE, a response is then communicated back to the ATE which then measures at least one parameter of or communicated through the first pin. An ATE test protocol which is adapted to measure at least one parameter of or communicated through the first pin is also provided.

As utilized herein, the term IC hereafter is intended to include and refer to an SOC and/or an MCM as well, and the reverse is also intended, vice versa, i.e., the terms SOC and/or MCM may also be used to refer to each other and/or to and/or include an IC. Note, SOCs and MCMs may be considered special kinds of ICs wherein SOCs are devices which may contain an assortment of one or more circuit features such as intellectual property (IP) blocks including, for example, logic cores, memories, embedded processors, and/or a range of mixed-signal and RF cores to support voice, video, audio and/or data communications. Similarly, MCMs are integrated devices which include a one or more previously separate integrated circuit devices incorporated onto a common substrate. Thus, SOCs and/or MCMs may represent a sort of IC integration, where stand-alone IC chipsets may be merged into a few or even into a single SOC and/or MCM.

The foregoing description has been presented for purposes of illustration and description. It is not intended to be exhaustive or to limit the invention to the precise forms disclosed. Obvious modifications or variations are possible in light of the above teachings. The embodiment or embodiments discussed, however, were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

Accordingly, what is claimed is:

1. A test development tool comprising:

test development program code for accessing a pre-established serial test program, said pre-established serial test program having been previously established for respective first and second sub-parts on a device under test, and said pre-established serial test program having a series of test code portions;

test development program code for evaluating the series of test code portions and determining whether any respective test code portions of said series of test code portions are independent subtest code portions that are independently operable thereby allowing for combination in a new concurrent test program, said test development program code for evaluating and determining providing at least one output result therefrom;

test development program code for defining a new concurrent test program for at least partially concurrently testing the first and second sub-parts of the device under test including defining at least one new test code portion for at least partially concurrently testing the first and second sub-parts of the device under test using the at least one output result of the test development code for evaluating and determining, the new test code portion being defined to have at least two of the independently operable subtest portions therein to operate concurrently.

2. A test development tool according to claim 1, in which the at least one new test code portion for at least partially concurrently testing provides for faster device test execution.

3. A test development tool according to claim 1 which further includes:
test development program code for prompting a user to participate in the evaluating and determining of the test code portions of the series of test code portions.

4. A test development tool according to claim 1 wherein the independent operability allowing for combination of the respective test code portions from the series of test code portions is due to originally independent vector operations of independently operable subtest code portions on respective sets of device pins.

5. A test development tool according to claim 4 wherein said independently operable subtest code portions are defined in the new test code portion as a single subtest code portion to be performed via at least two independent ports in a multi-port testing environment.

6. A test development tool according to claim 5 wherein the at least two independent ports are defined by a corresponding at least two independent sets of pins.

7. A test development tool according to claim 4 wherein the independent operability allowing for combination is determined as a result of the discovery of respective sets of independently operational pins.

8. A test development tool according to claim 1 wherein the independent operability allowing for combination is such that the respective subtest code portions are mutually exclusively operable, yet provide for concurrent operation via testing on discrete first and second sets of pins through discrete first and second ports.

9. A test development tool according to claim 1 wherein the code for evaluating and determining includes code for determining the independent operability allowing for combination which includes code for finding respective sets of pins with independent vector behavior these respective sets of pins thereby being dividable into and usable to define respective independent ports for parallel execution.

10. A test development tool according to claim 9 wherein the code for evaluating and determining includes code for finding similar vector behavior on respective sets of pins and wherein the code for defining a new concurrent test program includes code for joining the similar vector behavior on respective sets of pins into and thereby defining common or clock ports.

11. A test development tool according to claim 1 wherein the respective subtest code portions are evaluated for time of operation, and the test development program code for evaluating and determining further includes test development program code selected from the group consisting of code for prompting a user to participate in the evaluation of the timing of the subtest code portions and code for algorithmically evaluating and determining suggested timing combinations of test code portions.

12. A test development tool according to claim 11 wherein the respective subtest code portions are matched in a manner selected from the group consisting of:
matching with each other based upon the similarity of their respective times of operation;
matching respective subtest code portions wherein the respective subtest code portions are matched one to one having similar respective times of operation; and,
matching respective subtest code portions wherein a first one of the subtest code portions is matched with a plurality of the subtest code portions such that the total times of operation each of the plurality of subtest code portions is substantially similar to the first one of the subtest code portions from the first pre-established serial test program.

13. A test development tool according to claim 1 wherein the respective independently operable subtest code portions are evaluated for new subtest code portion sequencing; and, wherein the respective independently operable subtest code portions are matched with each other to create respective new subtest code portions and are placed into a new test flow as a result of the subtest sequencing evaluation.

14. A test development tool according to claim 13 which further includes:
test development program code for prompting a user to participate in the sequencing of the new subtest code portions.

15. A test development tool according to claim 1 which further includes:
test development program code for creating the new combined test code portions from the combination of one or more of the independently operable subtest code portions, said test development program code including subcode selected from the group consisting of:
pin assignment subcode;
subtest timing subcode;
voltage level subcode; and,
stimulus sequence subcode.

16. A test development tool according to claim 1 wherein:
the test development code for evaluating and determining further comprises test development program code for evaluating the independent operability of first and second sets of subtest code portions of first and second pre-established subtests of the pre-established serial test program and for determining an organization for a combination of respective independently operably subtest code portions of said first and second sets of subtest code portions, each of said first and second pre-established subtests having been previously established for respective first and second sub-parts of the pre-established combination device under test;
the test development program code for defining a new concurrent test program for at least partially concurrently testing the first and second sub-parts of the device under test further comprises test development program code for combining subtest code portions, including combining the separate setups of vectors, timings and levels from the respective first and second sets of subtest code portions for the subtest code portions being combined and defining a new concurrent test program including at least one new combined subtest code portion for at least partially concurrently testing first and second pre-established sub-parts using the at least one output result of the code for evaluating and determining; and, test development program code for providing at least one testmethod to run the at least one new combined subtest code portion of the new concurrent test program for the pre-established combination device under test including the first and second sub-parts.

17. A test development tool according to claim 16 further comprising test development program code for defining port assignments for the pins of the pre-established combination device under test.

18. A test development tool according to claim 17 in which the test development program code for defining port assignments is operative in at least one of the periods selected from the group consisting of: before an evaluation of the relative timings of first and second sets of subtest code portions, after an evaluation of the relative timings of first and second sets of subtest code portions, after the combining of subtest code portions, and after the providing of at least one testmethod to run the at least one new combined subtest code portion of the new concurrent test program.

19. A system comprising:
  means for accessing a pre-established serial test program, said pre-established serial test program having at least first and second sets of subtest code portions, each having been previously established as parts of the pre-established serial test program for respective pre-established sub-parts of a previously-established combined device;
  means for evaluating the at least first and second sets test code portions and for determining whether any subtest code portions of each of the respective first and second sets of test code portions are independently operable and thereby operatively compatible, said means for evaluating and determining providing an output result of the evaluation and determination;
  means for defining a new test program including at least one new subtest code portion using the output result of the evaluation and determination.

20. A method comprising:
  accessing a pre-established serial test program, said pre-established serial test program having been previously established for testing respective first and second pre-established sub-parts of a device under test, and said pre-established serial test program having respective first and second sets of subtest code portions;
  evaluating the first and second sets of subtest code portions and determining whether any respective subtest code portions of said first and second sets of subtest code portions have features allowing for combination into a new subtest code portion in a new test program, said evaluating and determining steps providing at least one output result thereof;
  defining a new test program including a new subtest code portion for concurrently testing first and second pre-established sub-parts using the at least one output result of the evaluating and determining steps.

21. Apparatus comprising:
  a computer readable medium; wherein a computer program is stored on the computer readable medium, the computer readable medium being adapted for developing at least a portion of a circuit device test in a concurrent multi-port automated test environment; said computer program comprising:
  program code to access a pre-established serial test program and to access any respective subtest code portions of the pre-established serial test program;
  program code to evaluate whether any of the respective subtest code portions may be combined to create a new subtest code portion in a new test program, said program code to evaluate providing at least one output result therefrom; and
  program code to define a new subtest code portion of a new test program using the at least one output result of the program code to evaluate.

\* \* \* \* \*